(12) United States Patent
Huang et al.

(10) Patent No.: US 12,142,681 B2
(45) Date of Patent: Nov. 12, 2024

(54) SEMICONDUCTOR DEVICE HAVING A SHAPED EPITAXIAL REGION WITH SHAPING SECTION

(71) Applicant: Taiwan Semiconductor Manufacturing Co., Ltd., Hsinchu (TW)

(72) Inventors: Yi-Min Huang, Tainan (TW); Shih-Chieh Chang, Taipei (TW); Cheng-Han Lee, New Taipei (TW)

(73) Assignee: TAIWAN SEMICONDUCTOR MANUFACTURING COMPANY, LTD., Hsin-Chu (TW)

( * ) Notice: Subject to any disclaimer, the term of this patent is extended or adjusted under 35 U.S.C. 154(b) by 239 days.

(21) Appl. No.: 17/379,569

(22) Filed: Jul. 19, 2021

(65) Prior Publication Data

US 2021/0351298 A1 Nov. 11, 2021

Related U.S. Application Data

(62) Division of application No. 16/569,842, filed on Sep. 13, 2019, now Pat. No. 11,069,810, which is a
(Continued)

(51) Int. Cl.
*H01L 29/78* (2006.01)
*H01L 21/02* (2006.01)
(Continued)

(52) U.S. Cl.
CPC .... *H01L 29/7848* (2013.01); *H01L 21/02532* (2013.01); *H01L 21/02576* (2013.01);
(Continued)

(58) Field of Classification Search
CPC ......... H01L 29/41783; H01L 29/66636; H01L 21/823814; H01L 29/41791; H01L 2029/7858
See application file for complete search history.

(56) References Cited

U.S. PATENT DOCUMENTS 7,667,271 B2   2/2010   Yu et al.
8,362,575 B2   1/2013   Kwok et al.
(Continued)

FOREIGN PATENT DOCUMENTS

CN   102104004 A   6/2011
CN   102169853 A   8/2011
(Continued)

*Primary Examiner* — Laura M Menz
*Assistant Examiner* — Candice Chan
(74) *Attorney, Agent, or Firm* — Slater Matsil, LLP

(57) ABSTRACT

A source/drain region of a semiconductor device is formed using an epitaxial growth process. In an embodiment a first step comprises forming a bulk region of the source/drain region using a first precursor, a second precursor, and an etching precursor. A second step comprises cleaning the bulk region with the etchant along with introducing a shaping dopant to the bulk region in order to modify the crystalline structure of the exposed surfaces. A third step comprises forming a finishing region of the source/drain region using the first precursor, the second precursor, and the etching precursor.

20 Claims, 17 Drawing Sheets

Related U.S. Application Data division of application No. 16/049,518, filed on Jul. 30, 2018, now Pat. No. 10,505,042, which is a division of application No. 15/284,101, filed on Oct. 3, 2016, now Pat. No. 10,164,098.

(60) Provisional application No. 62/357,161, filed on Jun. 30, 2016.

(51) Int. Cl.

| | | |
|---|---|---|
| *H01L 29/08* | (2006.01) | |
| *H01L 29/16* | (2006.01) | |
| *H01L 29/161* | (2006.01) | |
| *H01L 29/165* | (2006.01) | |
| *H01L 29/24* | (2006.01) | |
| *H01L 29/267* | (2006.01) | |
| *H01L 29/66* | (2006.01) | |

(52) U.S. Cl.
CPC ...... *H01L 21/0262* (2013.01); *H01L 29/0847* (2013.01); *H01L 29/16* (2013.01); *H01L 29/161* (2013.01); *H01L 29/165* (2013.01); *H01L 29/24* (2013.01); *H01L 29/267* (2013.01); *H01L 29/66628* (2013.01); *H01L 29/66636* (2013.01); *H01L 29/66795* (2013.01); *H01L 29/785* (2013.01); *H01L 29/7851* (2013.01); *H01L 2924/13067* (2013.01)

(56) References Cited

U.S. PATENT DOCUMENTS

| | | |
|---|---|---|
| 8,367,498 B2 | 2/2013 | Chang et al. |
| 8,440,517 B2 | 5/2013 | Lin et al. |
| 8,497,528 B2 | 7/2013 | Lee et al. |
| 8,610,240 B2 | 12/2013 | Lee et al. |
| 8,680,576 B2 | 3/2014 | Ching et al. |
| 8,723,272 B2 | 5/2014 | Liu et al. |
| 8,729,627 B2 | 5/2014 | Cheng et al. |
| 8,729,634 B2 | 5/2014 | Shen et al. |
| 8,785,285 B2 | 7/2014 | Tsai et al. |
| 8,796,759 B2 | 8/2014 | Perng et al. |
| 8,809,139 B2 | 8/2014 | Huang et al. |
| 8,828,823 B2 | 9/2014 | Liu et al. |
| 8,836,016 B2 | 9/2014 | Wu et al. |
| 8,841,701 B2 | 9/2014 | Lin et al. |
| 8,847,293 B2 | 9/2014 | Lee et al. |
| 8,853,025 B2 | 10/2014 | Zhang et al. |
| 9,117,905 B2 | 8/2015 | Su et al. |
| 9,515,187 B2 | 12/2016 | Kwok et al. |
| 9,530,661 B2 | 12/2016 | Kim et al. |
| 9,646,830 B2 | 5/2017 | Cai |
| 2011/0068407 A1 | 3/2011 | Yeh et al. |
| 2011/0210404 A1 | 9/2011 | Su et al. |
| 2012/0097977 A1 | 4/2012 | Yamaguchi |
| 2013/0011983 A1 | 1/2013 | Tsai et al. |
| 2013/0328126 A1 | 12/2013 | Tsai et al. |
| 2014/0120678 A1 | 5/2014 | Shinriki et al. |
| 2014/0134818 A1 | 5/2014 | Cheng et al. |
| 2014/0252412 A1 | 9/2014 | Tsai et al. |
| 2014/0264384 A1 | 9/2014 | Loboda et al. |
| 2014/0273379 A1* | 9/2014 | Tsai .................. H01L 21/02664 438/283 |
| 2015/0137183 A1 | 5/2015 | Kwok et al. |
| 2015/0318169 A1 | 11/2015 | Qi et al. |
| 2016/0365452 A1 | 12/2016 | Tung et al. |

FOREIGN PATENT DOCUMENTS

| | | |
|---|---|---|
| CN | 102456742 A | 5/2012 |
| CN | 103811351 A | 5/2014 |
| CN | 105097520 A | 11/2015 |
| TW | 201419527 A | 5/2014 |
| TW | 201607030 A | 2/2016 |

* cited by examiner

US 12,142,681 B2

SEMICONDUCTOR DEVICE HAVING A SHAPED EPITAXIAL REGION WITH SHAPING SECTION

PRIORITY CLAIM AND CROSS-REFERENCE

This application is a division of U.S. patent application Ser. No. 16/569,842, filed on Sep. 13, 2019 and entitled "Semiconductor Device Having a Shaped Epitaxial Region," which application is a division of U.S. patent application Ser. No. 16/049,518, filed on Jul. 30, 2018 and entitled "Semiconductor Device Having a Shaped Epitaxial Region," now U.S. Pat. No. 10,505,042 issued on Dec. 10, 2019, which application is a division of U.S. patent application Ser. No. 15/284,101, filed on Oct. 3, 2016 and entitled "Semiconductor Device and Method," now U.S. Pat. No. 10,164,098 issued on Dec. 25, 2018, which application claims the benefit of U.S. Provisional Application No. 62/357,161, filed on Jun. 30, 2016 and entitled "Semiconductor Device and Method," which applications are incorporated herein by reference.

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. However, as the minimum features sizes are reduced, additional problems arise that should be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
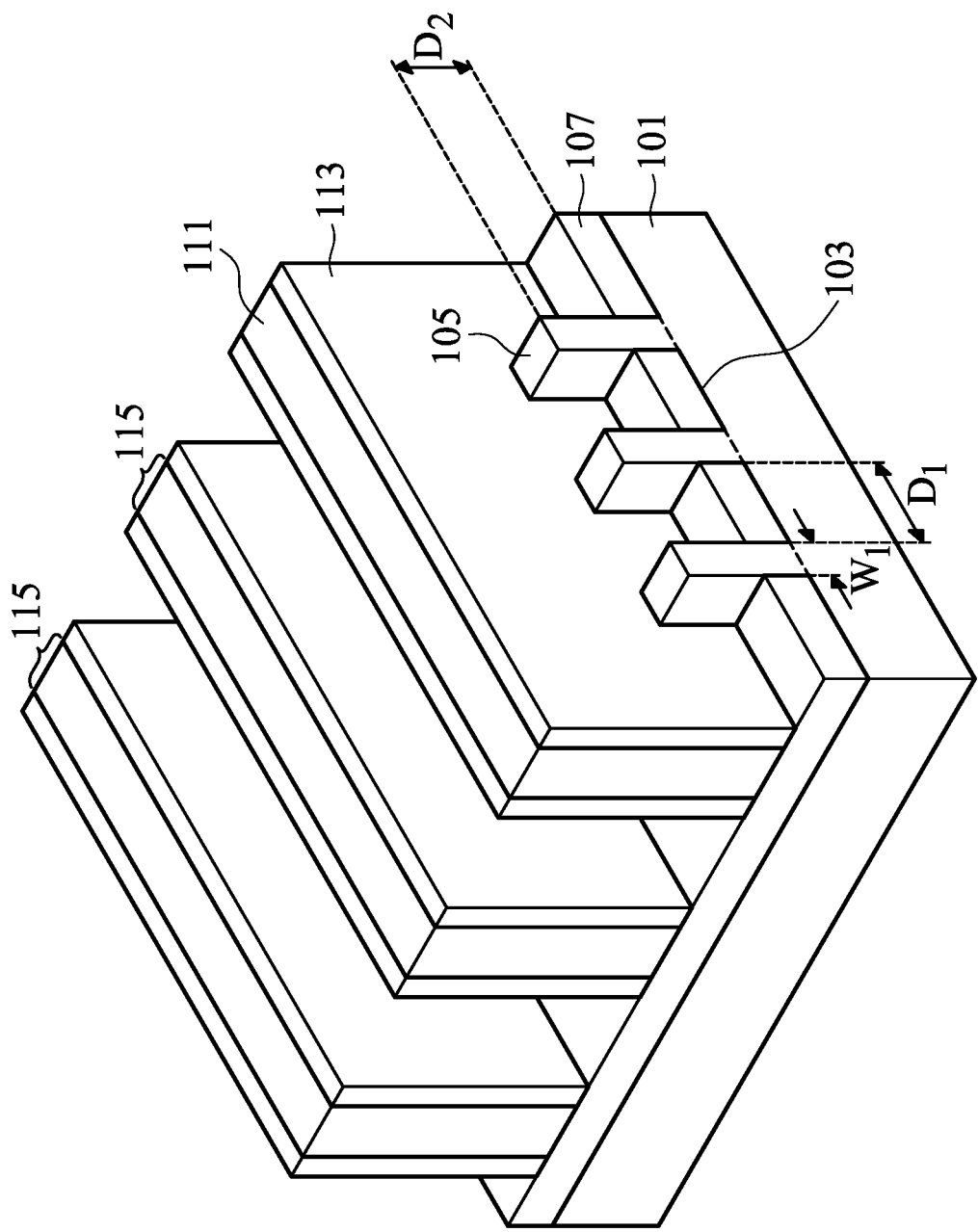
FIG. 1 illustrates fins for a FinFET transistor in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

With reference now to FIG. 1, there is shown a substrate 101 with first trenches 103 formed therein. The substrate 101 may be a silicon substrate, although other substrates, such as semiconductor-on-insulator (SOI), strained SOI, and silicon germanium on insulator, could be used. The substrate 101 may be a p-type semiconductor, although in other embodiments, it could be an n-type semiconductor.

The first trenches 103 may be formed as an initial step in the eventual formation of first isolation regions 107. The first trenches 103 may be formed using a masking layer (not separately illustrated in FIG. 1) along with a suitable etching process. For example, the masking layer may be a hardmask comprising silicon nitride formed through a process such as chemical vapor deposition (CVD), although other materials, such as oxides, oxynitrides, silicon carbide, combinations of these, or the like, and other processes, such as plasma enhanced chemical vapor deposition (PECVD), low pressure chemical vapor deposition (LPCVD), or even silicon oxide formation followed by nitridation, may be utilized. Once formed, the masking layer may be patterned through a suitable photolithographic process to expose those portions of the substrate 101 that will be removed to form the first trenches 103.

As one of skill in the art will recognize, however, the processes and materials described above to form the masking layer are not the only method that may be used to protect portions of the substrate 101 while exposing other portions of the substrate 101 for the formation of the first trenches 103. Any suitable process, such as a patterned and developed photoresist, may be utilized to expose portions of the substrate 101 to be removed to form the first trenches 103. All such methods are fully intended to be included in the scope of the present embodiments.

Once a masking layer has been formed and patterned, the first trenches 103 are formed in the substrate 101. The exposed substrate 101 may be removed through a suitable process such as reactive ion etching (RIE) in order to form the first trenches 103 in the substrate 101, although any suitable process may be used. In an embodiment, the first trenches 103 may be formed to have a first depth of less than about 5,000 Å from the surface of the substrate 101, such as about 2,500 Å.

However, as one of ordinary skill in the art will recognize, the process described above to form the first trenches 103 is merely one potential process, and is not meant to be the only embodiment. Rather, any suitable process through which the first trenches 103 may be formed may be utilized and any suitable process, including any number of masking and removal steps may be used.

In addition to forming the first trenches 103, the masking and etching process additionally forms fins 105 from those portions of the substrate 101 that remain unremoved. For convenience the fins 105 have been illustrated in the figures as being separated from the substrate 101 by a dashed line, although a physical indication of the separation may or may not be present. These fins 105 may be used, as discussed below, to form the channel region of multiple-gate FinFET transistors. While FIG. 1 only illustrates three fins 105 formed from the substrate 101, any number of fins 105 may be utilized.

The fins 105 may be formed such that they have a first width $W_1$ at the surface of the substrate 101 of between about 5 nm and about 80 nm, such as about 30 nm. Additionally, the fins 105 may be spaced apart from each other by a first distance $D_1$ of between about 10 nm and about 100 nm, such as about 50 nm. By spacing the fins 105 in such a fashion, the fins 105 may each form a separate channel region while still being close enough to share a common gate (discussed further below).

Once the first trenches 103 and the fins 105 have been formed, the first trenches 103 may be filled with a dielectric material and the dielectric material may be recessed within the first trenches 103 to form the first isolation regions 107. The dielectric material may be an oxide material, a high-density plasma (HDP) oxide, or the like. The dielectric material may be formed, after an optional cleaning and lining of the first trenches 103, using either a chemical vapor deposition (CVD) method (e.g., the HARP process), a high density plasma CVD method, or other suitable method of formation as is known in the art.

The first trenches 103 may be filled by overfilling the first trenches 103 and the substrate 101 with the dielectric material and then removing the excess material outside of the first trenches 103 and the fins 105 through a suitable process such as chemical mechanical polishing (CMP), an etch, a combination of these, or the like. In an embodiment, the removal process removes any dielectric material that is located over the fins 105 as well, so that the removal of the dielectric material will expose the surface of the fins 105 to further processing steps.

Once the first trenches 103 have been filled with the dielectric material, the dielectric material may then be recessed away from the surface of the fins 105. The recessing may be performed to expose at least a portion of the sidewalls of the fins 105 adjacent to the top surface of the fins 105. The dielectric material may be recessed using a wet etch by dipping the top surface of the fins 105 into an etchant such as HF, although other etchants, such as $H_2$, and other methods, such as a reactive ion etch, a dry etch with etchants such as $NH_3/NF_3$, chemical oxide removal, or dry chemical clean may be used. The dielectric material may be recessed to a second distance $D_2$ from the surface of the fins 105 of between about 50 Å and about 500 Å, such as about 400 Å. Additionally, the recessing may also remove any leftover dielectric material located over the fins 105 to ensure that the fins 105 are exposed for further processing.

As one of ordinary skill in the art will recognize, however, the steps described above may be only part of the overall process flow used to fill and recess the dielectric material. For example, lining steps, cleaning steps, annealing steps, gap filling steps, combinations of these, and the like may also be utilized to form and fill the first trenches 103 with the dielectric material. All of the potential process steps are fully intended to be included within the scope of the present embodiment.

After the first isolation regions 107 have been formed, a gate dielectric 109 (not visible in FIG. 1 but visible in the cross-section of FIG. 3B), a gate electrode 111 over the gate dielectric 109, and first spacers 113 may be formed over each of the fins 105. In an embodiment the gate dielectric 109 may be formed by thermal oxidation, chemical vapor deposition, sputtering, or any other methods known and used in the art for forming a gate dielectric. Depending on the technique of gate dielectric formation, the gate dielectric 109 thickness on the top of the fins 105 may be different from the gate dielectric thickness on the sidewall of the fins 105.

The gate dielectric 109 may comprise a material such as silicon dioxide or silicon oxynitride with a thickness ranging from about 3 angstroms to about 100 angstroms, such as about 10 angstroms. The gate dielectric 109 may be formed from a high permittivity (high-k) material (e.g., with a relative permittivity greater than about 5) such as lanthanum oxide ($La_2O_3$), aluminum oxide ($Al_2O_3$), hafnium oxide ($HfO_2$), hafnium oxynitride (HfON), or zirconium oxide ($ZrO_2$), or combinations thereof, with an equivalent oxide thickness of about 0.5 angstroms to about 100 angstroms, such as about 10 angstroms or less. Additionally, any combination of silicon dioxide, silicon oxynitride, and/or high-k materials may also be used for the gate dielectric 109.

The gate electrode 111 may comprise a conductive material and may be selected from a group comprising of polycrystalline-silicon (poly-Si), poly-crystalline silicon-germanium (poly-SiGe), metallic nitrides, metallic silicides, metallic oxides, metals, combinations of these, and the like. Examples of metallic nitrides include tungsten nitride, molybdenum nitride, titanium nitride, and tantalum nitride, or their combinations. Examples of metallic silicide include tungsten silicide, titanium silicide, cobalt silicide, nickel silicide, platinum silicide, erbium silicide, or their combinations. Examples of metallic oxides include ruthenium oxide, indium tin oxide, or their combinations. Examples of metal include tungsten, titanium, aluminum, copper, molybdenum, nickel, platinum, etc.

The gate electrode 111 may be deposited by chemical vapor deposition (CVD), sputter deposition, or other techniques known and used in the art for depositing conductive materials. The thickness of the gate electrode 111 may be in the range of about 200 angstroms to about 4,000 angstroms. The top surface of the gate electrode 111 may have a non-planar top surface, and may be planarized prior to patterning of the gate electrode 111 or gate etch. Ions may or may not be introduced into the gate electrode 111 at this point. Ions may be introduced, for example, by ion implantation techniques.

Once formed, the gate dielectric 109 and the gate electrode 111 may be patterned to form a series of gate stacks 115 over the fins 105. The gate stacks 115 define multiple channel regions located on each side of the fins 105 beneath the gate dielectric 109. The gate stacks 115 may be formed by depositing and patterning a gate mask (not shown) on the gate electrode 111 using, for example, deposition and photolithography techniques known in the art. The gate mask may incorporate commonly used masking materials, such as (but not limited to) photoresist material, silicon oxide, silicon oxynitride, and/or silicon nitride. The gate electrode 111 and the gate dielectric 109 may be etched using a dry etching process to form the patterned gate stacks 115.

Once the gate stacks 115 have been patterned, the first spacers 113 may be formed. The first spacers 113 may be formed on opposing sides of the gate stacks 115. The first spacers 113 are typically formed by blanket depositing a spacer layer (not separately illustrated in FIG. 1) on the previously formed structure. The spacer layer may comprise SiN, oxynitride, SiC, SiON, oxide, and the like and may be formed by methods utilized to form such a layer, such as chemical vapor deposition (CVD), plasma enhanced CVD, sputter, and other methods known in the art. The spacer layer may comprise a different material with different etch characteristics or the same material as the dielectric material within the first isolation regions 107. The first spacers 113 may then be patterned, such as by one or more etches to remove the spacer layer from the horizontal surfaces of the structure, to form the first spacers 113.

Figure 2:
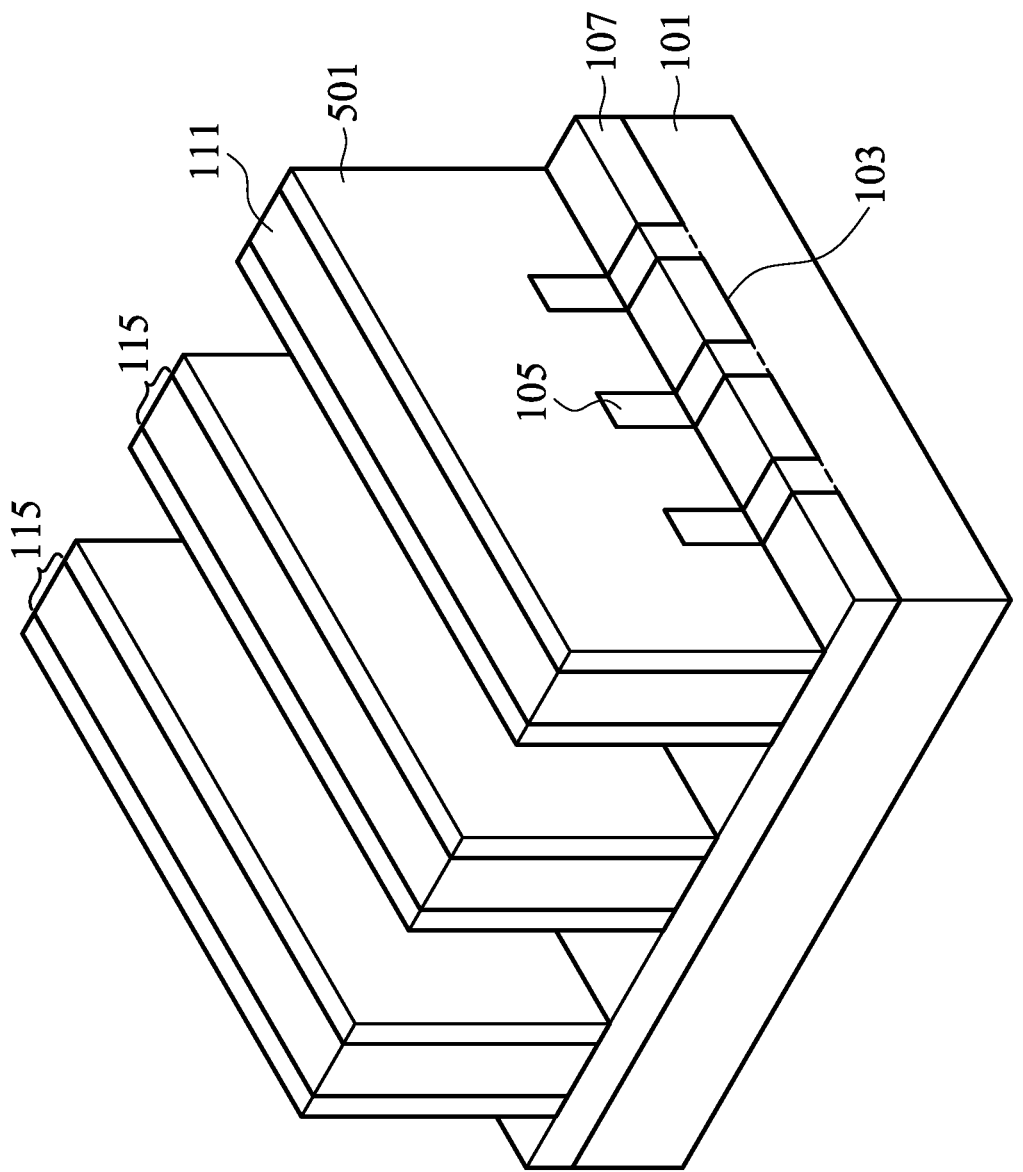
FIG. 2 illustrates a removal of a portion of the fins in accordance with some embodiments.

FIG. 2 illustrates a removal of the fins 105 from those areas not protected by the gate stacks 115 and the first spacers 113. This removal may be performed by a reactive ion etch (RIE) using the gate stacks 115 and the first spacers 113 as hardmasks, or by any other suitable removal process. The removal may be continued until the fins 105 are either planar with or below the surface of the first isolation regions 107.

Figure 3A:
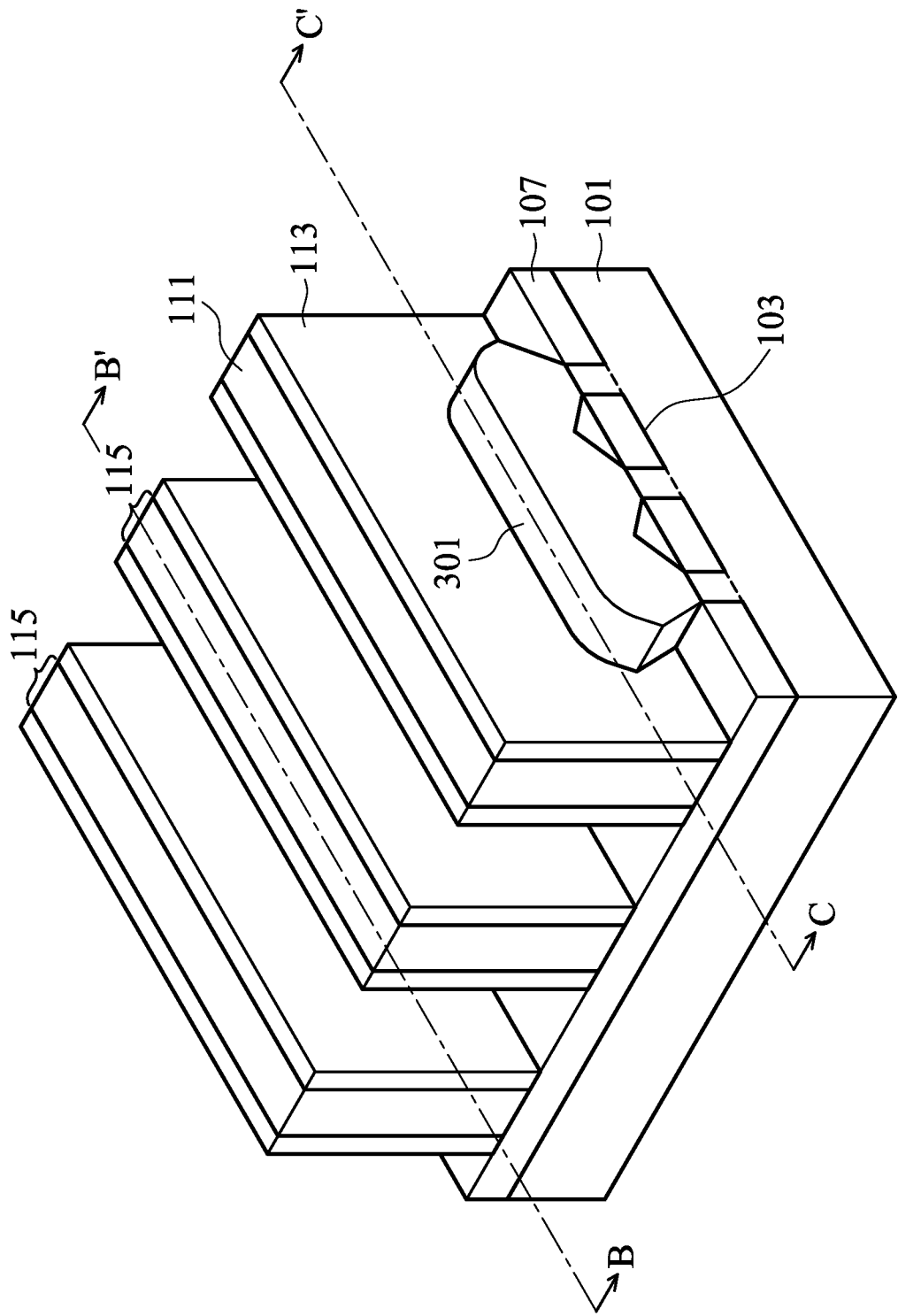
FIGS. 3A-3F illustrate a regrowth of source/drain regions within an epitaxial growth chamber in accordance with some embodiments.
Figure 3B:
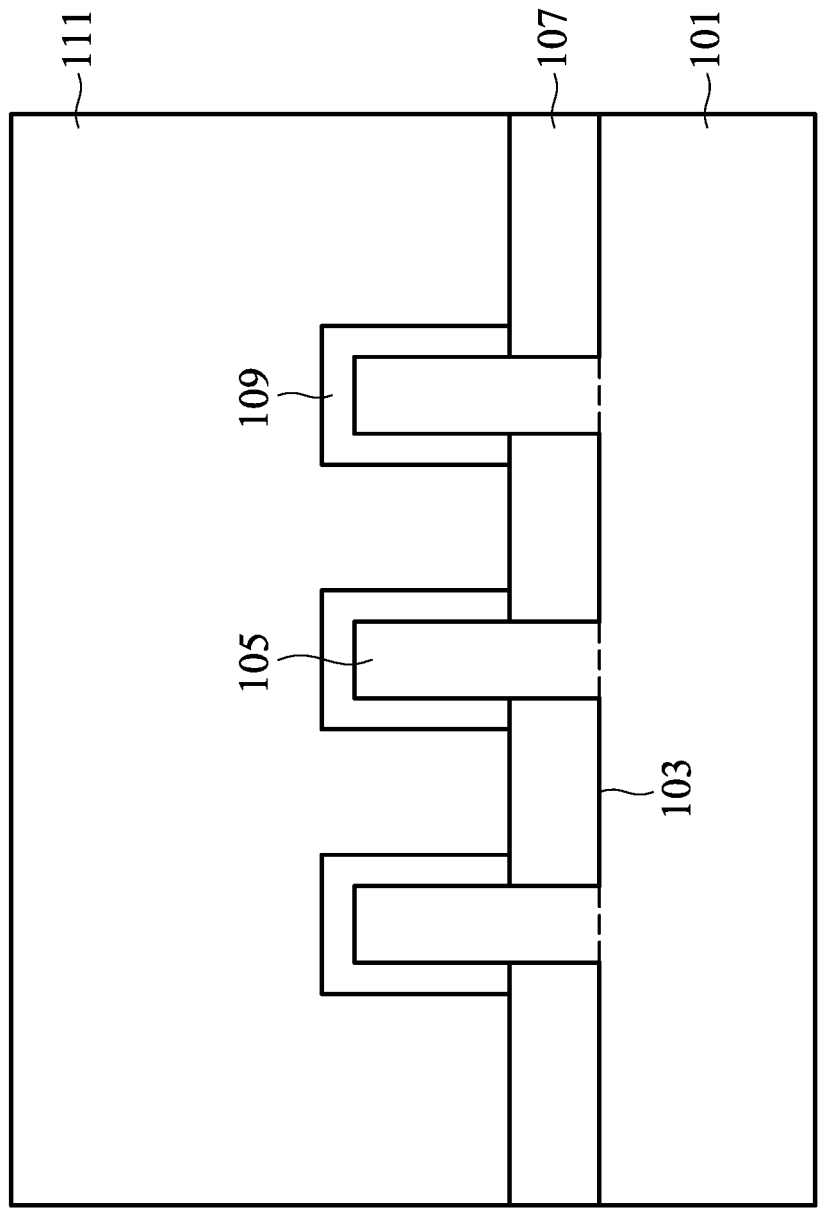
Figure 3C:
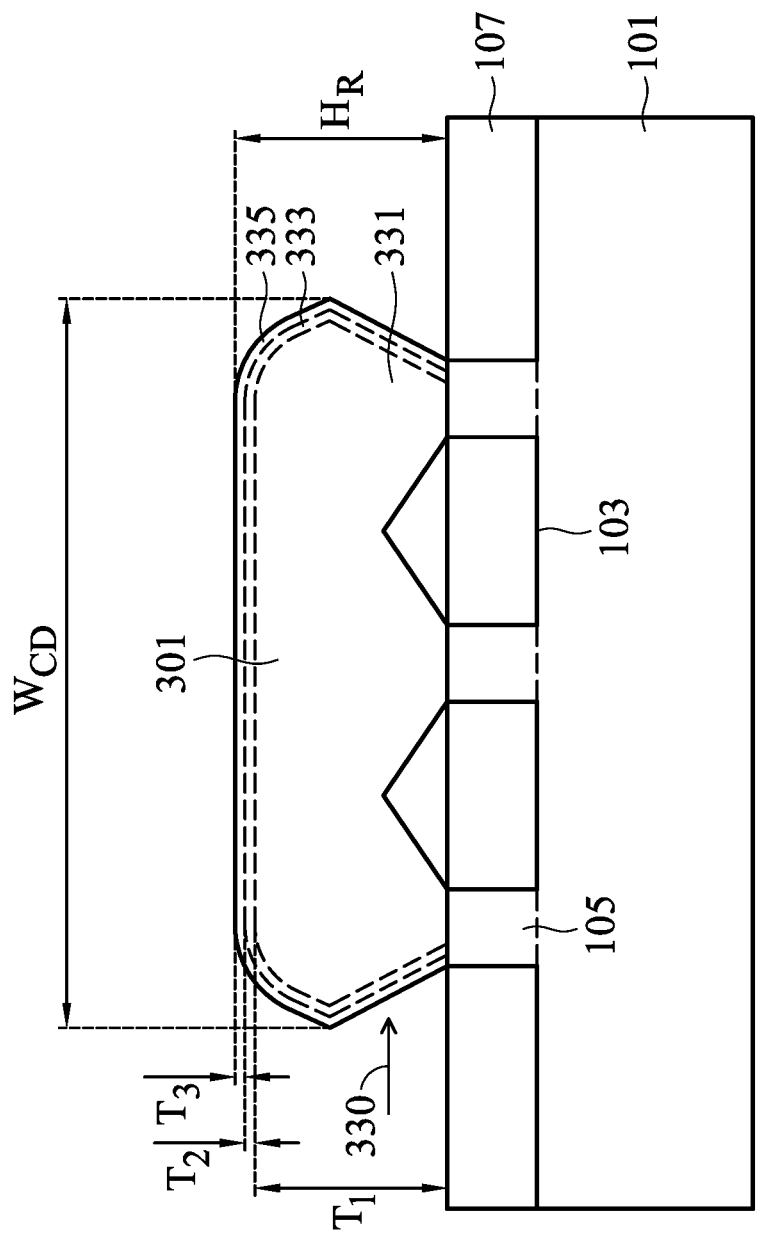

FIGS. 3A-3C illustrate a regrowth of material to form source/drain regions 301 in contact with each of the fins 105, with FIGS. 3B and 3C being cross-sectional views of FIG. 3A along lines B-B' and C-C', respectively. In an embodiment wherein the fins 105 comprise silicon, the source/drain regions 301 may be regrown through a selective epitaxial process with a doped material such as silicon phosphorous (SiP). However, any suitable material may be utilized.

Figure 3D:
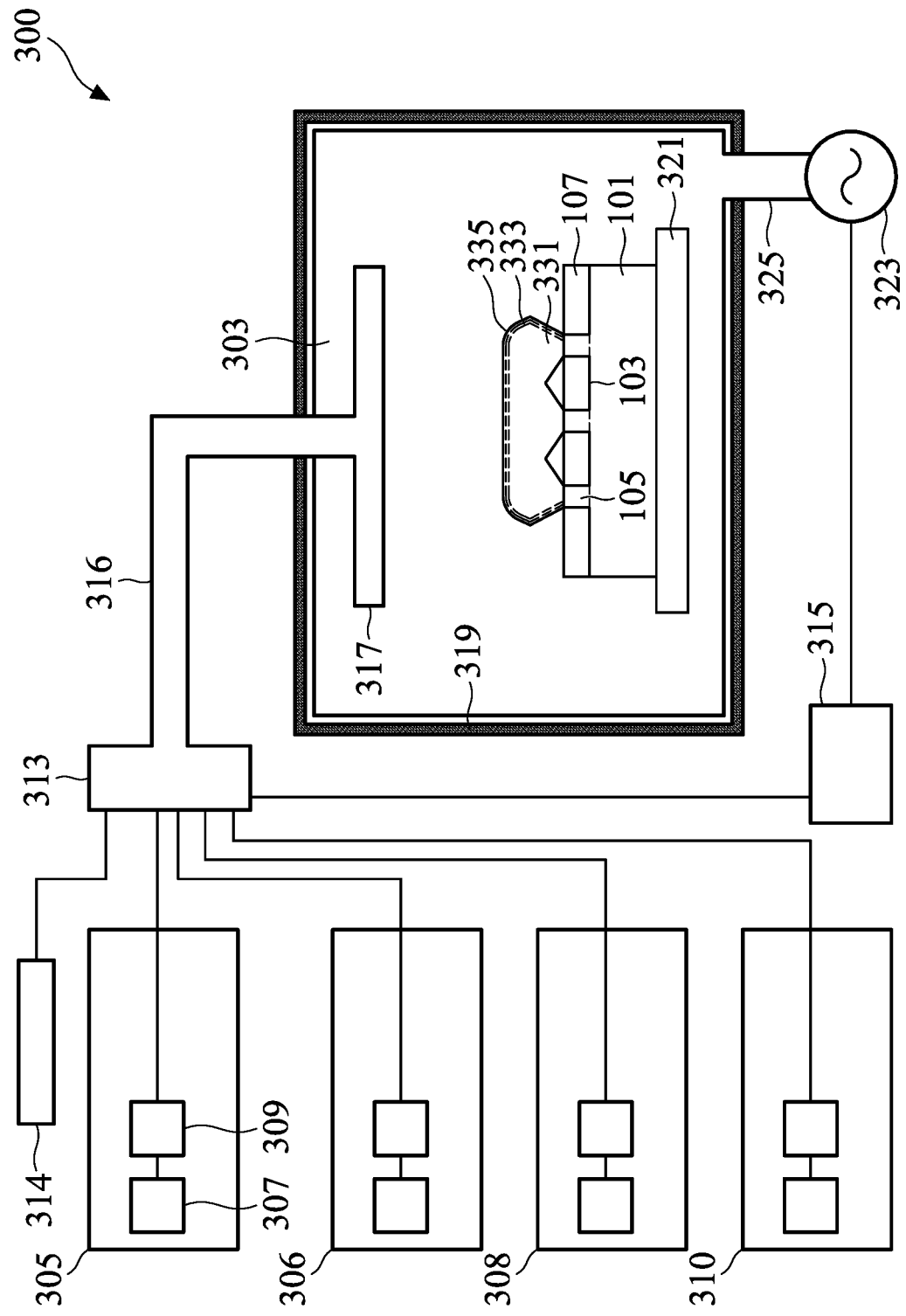

In an embodiment the epitaxial growth process used to form the source/drain regions 301 may utilize an epitaxial growth system 300 such as illustrated in FIG. 3D. The epitaxial growth system 300 may be utilized to receive precursor materials from a first precursor delivery system 305, a second precursor delivery system 306, a third precursor delivery system 308, and a fourth precursor delivery system 310, and form layers of materials (e.g., the source/drain regions 301) on the substrate 101 and the fins 105. In an embodiment the first precursor delivery system 305, the second precursor delivery system 306, the third precursor delivery system 308, and the fourth precursor delivery system 310 work in conjunction with one another to supply the various different precursor materials to an epitaxial growth chamber 303 wherein the substrate 101 (and consequently the fins 105) are placed. However, the first precursor delivery system 305, the second precursor delivery system 306, the third precursor delivery system 308, and the fourth precursor delivery system 310 may have physical components that are similar with each other.

For example, the first precursor delivery system 305, the second precursor delivery system 306, the third precursor delivery system 308, and the fourth precursor delivery system 310 may each include a gas system 307 and a flow controller 309 (labeled in FIG. 3D with regards to the first precursor delivery system 305 but not labeled for clarity with respect to the second precursor delivery system 306, the third precursor delivery system 308, and the fourth precursor delivery system 310). In an embodiment in which the first precursor is stored in a gaseous state, the gas system 307 may supply the first precursor to the epitaxial growth chamber 303. The gas system 307 may be a vessel, such as a gas storage tank, that is located either locally to the epitaxial growth chamber 303 or else may be located remotely from the epitaxial growth chamber 303. In another embodiment, the gas system 307 may be a facility that independently prepares and delivers the first precursor to the flow controller 309. Any suitable source for the first precursor may be utilized as the gas system 307, and all such sources are fully intended to be included within the scope of the embodiments.

The gas system 307 may supply the desired precursor to the flow controller 309. The flow controller 309 may be utilized to control the flow of the precursor to the precursor gas controller 313 and, eventually, to the epitaxial growth chamber 303, thereby also helping to control the pressure within the epitaxial growth chamber 303. The flow controller 309 may be, e.g., a proportional valve, a modulating valve, a needle valve, a pressure regulator, a mass flow controller, combinations of these, or the like. However, any suitable method for controlling and regulating the flow of the first precursor may be utilized, and all such components and methods are fully intended to be included within the scope of the embodiments.

Additionally, in an embodiment in which the first precursor is stored in a solid or liquid state, the gas system 307 may also store or receive a carrier gas and the carrier gas may be introduced into a precursor canister (not separately illustrated), which stores the first precursor in the solid or liquid state. The carrier gas is then used to push and carry the first precursor as it either evaporates or sublimates into a gaseous section of the precursor canister before being sent to the precursor gas controller 313. Any suitable method and combination of units may be utilized to provide the first precursor, and all such combinations of units are fully intended to be included within the scope of the embodiments.

However, as one of ordinary skill in the art will recognize, while the first precursor delivery system 305, the second precursor delivery system 306, the third precursor delivery system 308, and the fourth precursor delivery system 310 have been described herein as having identical components, this is merely an illustrative example and is not intended to limit the embodiments in any fashion. Any type of suitable precursor delivery system, with any type and number of individual components identical to or different from any of the other precursor delivery systems within the epitaxial growth system 300, may be utilized. All such precursor systems are fully intended to be included within the scope of the embodiments.

The first precursor delivery system 305, the second precursor delivery system 306, the third precursor delivery system 308, and the fourth precursor delivery system 310 may supply their individual precursor materials into a precursor gas controller 313. The precursor gas controller 313 connects and isolates the first precursor delivery system 305, the second precursor delivery system 306, the third precursor delivery system 308, and the fourth precursor delivery system 310 from the epitaxial growth chamber 303 in order to deliver the desired precursor materials to the epitaxial growth chamber 303 (discussed further below). The precursor gas controller 313 may include such devices as valves, flow meters, sensors, and the like to control the delivery rates of each of the precursors, and may be controlled by instructions received from the control unit 315 (described further below with respect to FIG. 3E).

The precursor gas controller 313, upon receiving instructions from the control unit 315, may open and close valves so as to connect one or more of the first precursor delivery system 305, the second precursor delivery system 306, the third precursor delivery system 308, and the fourth precursor delivery system 310 to the epitaxial growth chamber 303 and direct a desired precursor material through a manifold 316, into the epitaxial growth chamber 303, and to a showerhead 317. The showerhead 317 may be utilized to disperse one or more of the chosen precursor materials into the epitaxial growth chamber 303 and may be designed to evenly disperse the precursor material in order to minimize undesired process conditions that may arise from uneven dispersal. In an embodiment the showerhead 317 may have a circular design with openings dispersed evenly around the showerhead 317 to allow for the dispersal of the desired precursor materials into the epitaxial growth chamber 303.

However, as one of ordinary skill in the art will recognize, the introduction of precursor materials to the epitaxial growth chamber 303 through a single showerhead 317 or through a single point of introduction as described above is intended to be illustrative only and is not intended to be limiting to the embodiments. Any number of separate and independent showerheads 317 or other openings to introduce the various precursor materials into the epitaxial growth chamber 303 may be utilized. All such combinations of showerheads and other points of introduction are fully intended to be included within the scope of the embodiments.

The epitaxial growth chamber 303 may receive the desired precursor materials and expose the precursor materials to the substrate 101 and the fins 105, and the epitaxial growth chamber 303 may be any desired shape that may be suitable for dispersing the precursor materials and contacting the precursor materials with the substrate 101 and the fins 105. In the embodiment illustrated in FIG. 3D, the epitaxial growth chamber 303 has a cylindrical sidewall and a bottom. However, the epitaxial growth chamber 303 is not limited to a cylindrical shape, and any other suitable shape, such as a hollow square tube, an octagonal shape, or the like, may be utilized. Furthermore, the epitaxial growth chamber 303 may be surrounded by a housing 319 made of material that is inert to the various process materials. As such, while the housing 319 may be any suitable material that can withstand the chemistries and pressures involved in the deposition process, in an embodiment the housing 319 may be steel, stainless steel, nickel, aluminum, alloys of these, combinations of these, and like.

Within the epitaxial growth chamber 303 the substrate 101 may be placed on a mounting platform 321 in order to position and control the substrate 101 and the fins 105 during the epitaxial growth processes. The mounting platform 321 may include heating mechanisms in order to heat the substrate 101 during the epitaxial growth processes. Furthermore, while a single mounting platform 321 is illustrated in FIG. 3D, any number of mounting platforms 321 may additionally be included within the epitaxial growth chamber 303.

Additionally, the epitaxial growth chamber 303 and the mounting platform 321 may be part of a cluster tool system (not shown). The cluster tool system may be used in conjunction with an automated handling system in order to position and place the substrate 101 into the epitaxial growth chamber 303 prior to the epitaxial growth processes, position, hold the substrate 101 during the epitaxial growth processes, and remove the substrate 101 from the epitaxial growth chamber 303 after the epitaxial growth processes.

The epitaxial growth chamber 303 may also have an exhaust outlet 325 for exhaust gases to exit the epitaxial growth chamber 303. A vacuum pump 323 may be connected to the exhaust outlet 325 of the epitaxial growth chamber 303 in order to help evacuate the exhaust gases. The vacuum pump 323, under control of the control unit 315, may also be utilized to reduce and control the pressure within the epitaxial growth chamber 303 to a desired pressure and may also be utilized to evacuate precursor materials from the epitaxial growth chamber 303 in preparation for the introduction of the next precursor material.

Figure 3E:
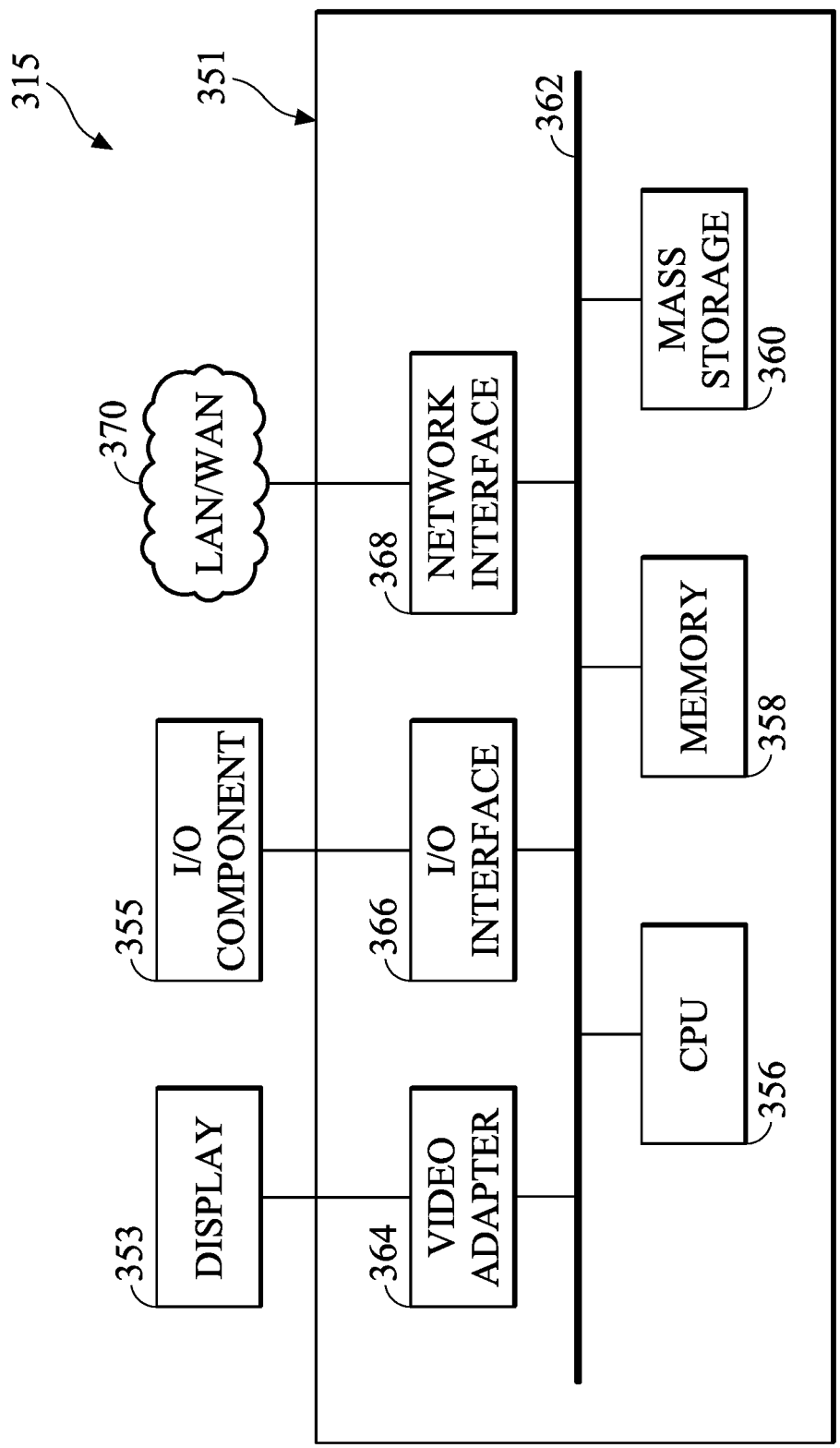

FIG. 3E illustrates an embodiment of the control unit 315 that may be utilized to control the precursor gas controller 313 and the vacuum pump 323 (as illustrated in FIG. 3D). The control unit 315 may be any form of computer processor that can be used in an industrial setting for controlling process machines. In an embodiment the control unit 315 may comprise a processing unit 351, such as a desktop computer, a workstation, a laptop computer, or a dedicated unit customized for a particular application. The control unit 315 may be equipped with a display 353 and one or more input/output components 355, such as instruction outputs, sensor inputs, a mouse, a keyboard, printer, combinations of these, or the like. The processing unit 351 may include a central processing unit (CPU) 356, memory 358, a mass storage device 360, a video adapter 364, and an I/O interface 366 connected to a bus 362.

The bus 362 may be one or more of any type of several bus architectures including a memory bus or memory controller, a peripheral bus, or video bus. The CPU 356 may comprise any type of electronic data processor, and the memory 358 may comprise any type of system memory, such as static random access memory (SRAM), dynamic random access memory (DRAM), or read-only memory (ROM). The mass storage device 360 may comprise any type of storage device configured to store data, programs, and other information and to make the data, programs, and other information accessible via the bus 362. The mass storage device 360 may comprise, for example, one or more of a hard disk drive, a magnetic disk drive, or an optical disk drive.

The video adapter 364 and the I/O interface 366 provide interfaces to couple external input and output devices to the processing unit 351. As illustrated in FIG. 3E, examples of input and output devices include the display 353 coupled to the video adapter 364 and the I/O component 355, such as a mouse, keyboard, printer, and the like, coupled to the I/O interface 366. Other devices may be coupled to the processing unit 356, and additional or fewer interface cards may be utilized. For example, a serial interface card (not shown) may be used to provide a serial interface for a printer. The processing unit 351 also may include a network interface 368 that may be a wired link to a local area network (LAN) or a wide area network (WAN) 370 and/or a wireless link.

It should be noted that the control unit 315 may include other components. For example, the control unit 315 may include power supplies, cables, a motherboard, removable storage media, cases, and the like. These other components, although not shown in FIG. 3E, are considered part of the control unit 315.

In preparation for the formation of the source/drain regions 301, a first precursor material is placed into or formed by the first precursor delivery system 305. For example, in an embodiment in which a doped semiconductor material such as silicon phosphorous is desired to be grown, the first precursor material may be a silicon-containing precursor material such as dichlorosilane (DCS), although other suitable precursors, such as silane ($SiH_4$) or disilane ($Si_2H_6$), may also be utilized. All suitable precursor materials are fully intended to be included within the scope of the embodiments.

Additionally, a second precursor material may be placed into or formed by the second precursor delivery system 306. In the embodiment the second precursor may be used to provide a doping material that complements the semiconductor material present in the first precursor material. For example, in an embodiment in which a layer of silicon doped with phosphorous (SiP) is desired to be grown as the source/drain regions 301 and the first precursor material is dichlorosilane, the second precursor material may be a material that comprises the desired dopant such as phosphorous (P). In a particular embodiment the second precursor material is $PH_3$. However, any suitable dopant containing material, such as arsenic (As) or antimony (Sb), may be utilized and placed within the second precursor delivery system 306.

In addition to the first precursor material and the second precursor material that are collectively utilized to grow the desired material (e.g., SiP), an etching precursor may also be utilized during the growth process, and may be placed in the third precursor delivery system 308. In an embodiment in which the material to be grown will at least partially deposit on materials other than the exposed fins 105 (such as by growing on the exposed surfaces of the first spacers 113), the addition of an etching precursor will work to remove epitaxially grown material from these undesired locations, and helps to cause the selective growth be more selective. In an embodiment the etching precursor is a precursor that will remove undesired growth of the grown material while still allowing for growth of the desired material over the fins 105, and may be an etchant such as hydrochloric acid (HCl). However, any suitable etching precursor may be utilized.

Finally, in order to help control the three-dimensional shape of the source/drain regions 301 during the epitaxial growth process by helping the etching efficiency of the etching precursor during a cleaning process (discussed further below), a shaping precursor may be placed in the fourth precursor delivery system 310. In an embodiment the shaping precursor is a material that, when incorporated into the source/drain regions 301 during the cleaning process, will help to amorphize and modify the crystalline structure of the source/drain regions 301 that has already been grown prior to introduction of the shaping precursor. In a particular embodiment in which the grown material is silicon phosphorous, the shaping precursor is a material that comprises a material with a different crystalline lattice constant, such as germanium. In a particular embodiment the shaping precursor is $GeH_4$. However, any suitable shaping precursor may be utilized.

Once the first precursor material, the second precursor material, the etching precursor and the shaping precursor are ready in the first precursor delivery system 305, the second precursor delivery system 306, the third precursor delivery system 308, and the fourth precursor delivery system 310, respectively, the formation of the source/drain regions 301 may be initiated by the control unit 315 sending an instruction to the precursor gas controller 313 to start a first step 601 and connect the first precursor delivery system 305, the second precursor delivery system 306, and the third precursor delivery system 308 to the epitaxial growth chamber 303. Once connected, the first precursor delivery system 305, the second precursor delivery system 306 and the third precursor delivery system 308 can deliver the first precursor material (e.g., dichlorosilane), the second precursor material (e.g., $PH_3$), and the etching precursor (e.g., HCl) to the showerhead 317 through the precursor gas controller 313 and the manifold 316. The showerhead 317 can then disperse the first precursor material, the second precursor material, and the etching precursor into the epitaxial growth chamber 303, wherein the first precursor material and the second precursor material can react to the exposed surface of the fins 105 and begin to grow a bulk section 331 of the source/drain regions 301 on the exposed sections of the fins 105.

In an embodiment in which the source/drain regions 301 are, e.g., SiP, the first precursor material (e.g., dichlorosilane) may be flowed into the epitaxial growth chamber 303 at a flow rate of between about 10 sccm and about 10000 sccm, such as about 500 sccm while the second precursor material (e.g., $PH_3$) is flowed into the epitaxial growth chamber 303 at a flow rate of between about 10 sccm and about 1000 sccm, such as about 100 sccm. Additionally, the epitaxial growth chamber 303 during the first step 601 may be held at a pressure of between about 5 Torr and about 1000 Torr, such as about 100 Torr, and a temperature of between about 400° C. and about 1000° C., such as about 600° C. However, as one of ordinary skill in the art will recognize, these process conditions are only intended to be illustrative, as any suitable process conditions may be utilized while remaining within the scope of the embodiments.

Additionally, while the first precursor material and the second precursor material are being introduced into the epitaxial growth chamber 303, the first precursor material and the second precursor material will react not solely on the fins 105 (where the growth is desired), but may also occur on other structures, such as the first spacers 113 (where the growth is not desired). To remove this undesired growth, the etching precursor is also added during the first step 601 of the growth process along with the first precursor material and the second precursor material. In an embodiment in which the source/drain regions 301 are SiP and the etching precursor is hydrochloric acid, the etching precursor may be flowed into the epitaxial growth chamber 303 at a flow rate of between about 10 sccm and about 30000 sccm, such as about 100 sccm. Such a flow rate will work to remove grown material from surfaces where it is undesired. However, any suitable flow rate may be utilized.

However, as the etching precursor is cleaning the undesired surfaces during the initial growth stage of the source/drain regions 301 (e.g., the first step 601) along with the first precursor material and the second precursor material, the etching precursor will also react with the material of the bulk section 331 of the source/drain region 301 as it is being grown. However, as the material of the bulk section 331 (e.g., SiP) is grown, the etching precursor will preferentially etch those surfaces of the bulk section 331 of the source/drain region 301 that are oriented in a (110) direction, such as the sidewalls of the grown material. As such, the etching precursor will have a first lateral etch rate (in the direction of the arrow labeled 330 in FIG. 3A) during the first step 601 of between about 0.1 nm/min and about 100 nm/min, such as about 10 nm/min. However, any suitable lateral etch rate may be utilized.

In an embodiment the growth of the source/drain regions 301 in the first step 601 is continued to grow a bulk section 331 of the source/drain regions 301. For example, the first step 601 may be continued for a time period of between about 10 seconds and about 1000 seconds, such as about 500 seconds. However, any suitable time may be utilized.

By forming the bulk section 331 of the source/drain regions 301 as described above, the bulk section 331 of the source/drain regions 301 may be formed with a relatively consistent concentration of the dopant (e.g., phosphorous). In an embodiment the bulk section 331 of the source/drain regions 301 may be formed to have a first dopant concentration of between about 1E+20 atom/cm$^3$ and about 1E+23 atom/cm$^3$, such as about 1E+21 atom/cm$^3$. However, any suitable concentration may be used.

Additionally, while the source/drain regions 301 are being grown upwards on the fins 105, growth will also occur in a horizontal direction as well. While part of the growth for the source/drain regions 301 will eventually meet and merge in a region between the fins 105, as the source/drain region 301 extends horizontally away from the fins (e.g., to the left and right of the figures), separate ones of the source/drain regions 301 for different devices (not separately illustrated) may grow into each other, forming an undesired connection between what are intended to be separate source/drain regions 301. Such growth could lead to undesired connections and defects within the finished product.

As such, to help increase the efficiency of the etching precursor and help better shape the source/drain regions 301 such that they do not undesirably grow together, a second step 603, such as a cleaning step, is performed that introduces the shaping precursor. In an embodiment the second step 603 may be initiated by the control unit 315 sending an instruction to the precursor gas controller 313 to disconnect the first precursor delivery system 305 and the second precursor delivery system 306 from the epitaxial growth chamber 303, thereby stopping the flow of the first precursor and the second precursor from continuing to enter the epitaxial growth chamber 303.

Additionally, the control unit 315 will also continue the flow of the etching precursor after the disconnection of the first precursor delivery system 305 and the second precursor delivery system 306. In an embodiment the etching precursor in the second step 603 may be flowed into the epitaxial growth chamber 303 at a flow rate of between about 10 sccm and about 30000 sccm, such as about 100 sccm. Additionally, the epitaxial growth chamber 303 during the second step 603 may be held at a pressure of between about 5 Torr and about 1000 Torr, such as about 100 Torr, and a temperature of between about 400° C. and about 1000° C., such as about 600° C. However, as one of ordinary skill in the art will recognize, these process conditions are only intended to be illustrative, as any suitable process conditions may be utilized while remaining within the scope of the embodiments.

Additionally, in order to help the cleaning process, the control unit 315 will also send an instruction to the precursor gas controller 313 to connect the fourth precursor delivery system 310. By connecting the fourth precursor delivery system 310, the control unit 315 will introduce the shaping precursor (e.g., GeH$_4$) into the epitaxial growth chamber 303 at the same time as the etching precursor (e.g., HCl). In an embodiment in which the material of the source/drain regions 301 is SiP, the etching precursor is HCl, and the shaping precursor is GeH$_4$, the shaping precursor may be flowed into the epitaxial growth chamber 303 at a flow rate of between about 10 sccm and about 10000 sccm, such as about 100 sccm. Additionally, the shaping precursor and etching precursor may be flowed together for a time of between about 10 seconds and about 500 seconds, such as about 100 seconds. However, any suitable flow rate and time may be utilized.

With the introduction of the shaping precursor, the shaping precursor (e.g., GeH$_4$) will react with the material of the bulk section 331 of the source/drain regions 301 that has already been deposited (e.g., SiP) through processes that include HCl/GeH$_4$ adsorption, segregation, SiCL$_2$ desorption etching, H$_2$ desorption, and the removal of GeCl$_2$ and SiCl$_2$. These reaction processes will work to clean the bulk section 331 of the source/drain regions 301 and will also incorporate a portion of the shaping precursor (e.g., germanium) into the material of the source/drain regions 301 to form a shaping section 333 or cleaning section of the source/drain region 301. In an embodiment in which the source/drain regions 301 are SiP and the shaping precursor is GeH$_4$, the germanium from the GeH$_4$ will react with the SiP that has already been deposited and the germanium will become incorporated into a portion of the source/drain regions 301, exchanging places with silicon atoms and diffusing into silicon alloys that can reduce the silicon bonding energy and modify the crystalline structure. Such a reduction in the bonding energy can help achieve a better silicon etching efficiency and achieve an overall better shape for the epitaxially grown source/drain regions 301.

In an embodiment, after the second step 603, the bulk section 331 of the source/drain region 301 may have a first thickness T$_1$ over the fins 105 of between about 10 nm and about 100 nm, such as about 50 nm and the shaping section 333 of the source/drain regions 301 may have a second thickness T$_2$ of between about 1 nm and about 50 nm, such as about 10 nm. Additionally, the shaping section 333 may also have an atomic concentration of germanium of between about 1% and about 10%. However, any suitable concentration of germanium may also be used.

By incorporating the material of the shaping precursor, the crystalline structure of the exposed surfaces of the source/drain region 301 will be modified and the silicon bonding energy will be reduced. In a particular embodiment, by forming the shaping section 333 of the source/drain regions 301 out of the bulk section 331 of the source/drain regions 301, the bonding energy of the silicon within the exposed surfaces of the shaping section 333 of the source/drain regions 301 will have a decreased bonding energy. Additionally, given that hydrochloric acid will preferentially react with surfaces oriented along the (110) direction, such a lowering of the bonding energy within the shaping section 333 of the source/drain regions 301 will enhance the etching precursor (e.g., HCl) preferential reaction and removal of the surfaces of the sidewalls while not removing as much of the material at the top of the source/drain regions 301 (e.g., in the (100) direction). As such, the etching precursor may have a second lateral etch rate in the second step 603 that is higher than the first lateral etch rate of the first step 601, such as by being between about 0.2 nm/min and about 100 nm/min, such as about 15 nm/min.

Figure 4A:
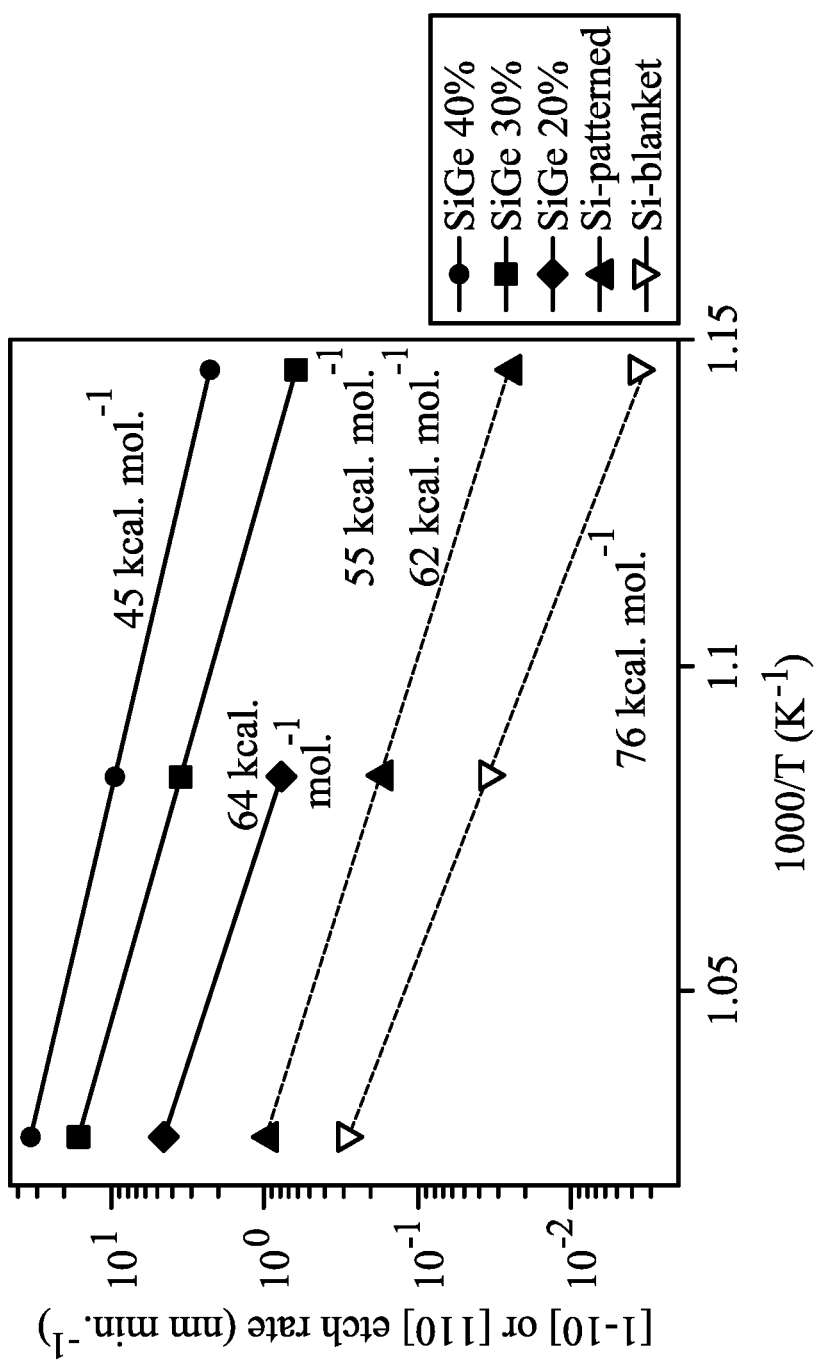
FIGS. 4A-4B illustrates etch rate data for silicon and for silicon with germanium incorporated in accordance with some embodiments.
Figure 4B:
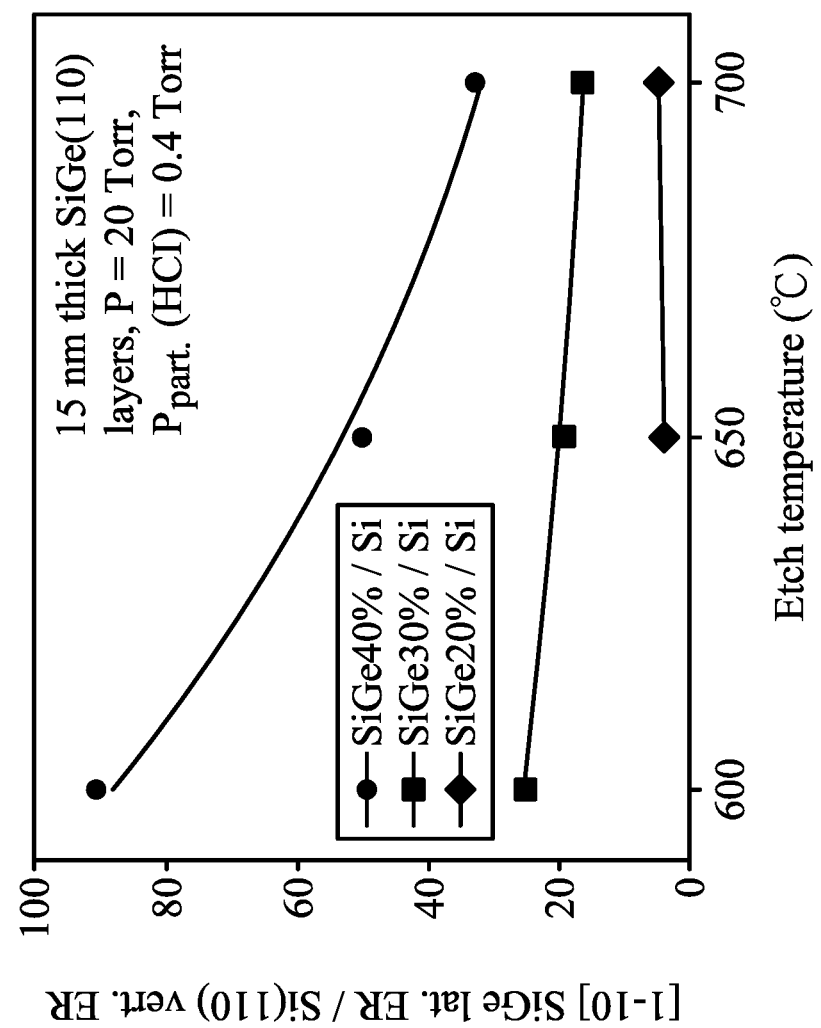

Data regarding the increase in etch rate both in general as well as with respect to a ratio between lateral and vertical etching may be seen in FIGS. 4A-4B. In particular, FIG. 4A illustrates that, without the incorporation of the germanium, blanket deposited silicon will have a bonding energy of about 76 kcal/mol and have a first etch rate along a [110] direction. However, with the introduction of germanium into the silicon (and with the effect being larger as more silicon is introduced), the etch rate of silicon along the [110]

orientation increases along with the amount of germanium. Additionally, looking at FIG. 4B, this figure illustrates the increase in the ratio between the lateral etch rate and the vertical etch rate of silicon when increasing levels of germanium are added. As can be seen, as more germanium is added, the ratio of the lateral etch rate to the vertical etch rate also increases.

Such a preferential reaction with and removal of material from the sidewalls of the shaping section 333 of the source/drain regions 301 instead of the top of the shaping section 333 of the source/drain regions 301 will work to make the overall source/drain regions 301 thinner than would otherwise be possible for a particular height, and will also help to separate the different ones of the source/drain regions 301 and keep them from undesirably merging with other fins 105 (not separately illustrated in FIG. 3A).

Once the second step 603 has been completed, a third step 605 may be performed in order to continue the epitaxial growth of the source/drain regions 301 after the second step 603. In an embodiment the third step 605 may be initiated by the control unit 315 sending an instruction to the precursor gas controller 313 to disconnect the fourth precursor delivery system 310 and stop the flow of the shaping precursor to the epitaxial growth chamber 303. With the flow of the shaping precursor to the epitaxial growth chamber 303 stopped, the control unit 315 will send an instruction to the precursor gas controller 313 to re-connect the first precursor delivery system 305 and the second precursor delivery system 306 (along with the third precursor delivery system 308). In an embodiment the process conditions and flow rates of the first precursor, the second precursor, and the etching precursor for the third step 605 may be as described above with respect to the first step 601, although in other embodiments they may be different.

The third step 605 may be continued to form a finishing section 335 of the source/drain regions 301 over the shaping section 333 of the source/drain regions 301. In an embodiment the finishing section 335 of the source/drain regions 301 may be formed to have a third thickness $T_3$ of between about 1 nm and about 50 nm, such as about 10 nm, and may be formed by continuing the process for a time of between about 10 second and about 500 second, such as about 100 second. However, any suitable thickness and time of formation may be used.

However, in addition to simply forming another layer of material, the presence of the shaping dopant (e.g., germanium) within the shaping section 333 of the source/drain region 301 will not only help to make the lateral etching more efficient (thereby leading to a taller and thinner source/drain region 301), but will also work to more effectively incorporate the dopants (e.g., P) from the second precursor into the source/drain regions 301 as the source/drain regions 301 are being grown. As such, a concentration of the dopant within the finishing section 335 will be higher than a concentration of the dopant within the bulk section 331 of the source/drain region 301. For example, in an embodiment in which phosphorous is being incorporated into the source/drain regions 301, the phosphorous may have a second concentration in the finishing section 335 of between about 1E+20 atom/cm$^3$ and about 1E+24 atom/cm$^3$, such as about 1.5E+21 atom/cm$^3$. However, any suitable concentration may be utilized.

However, as one of ordinary skill in the art will recognize, the above described process is merely exemplary and is not intended to limit the embodiments. Rather, any suitable number of steps, such as purging the epitaxial growth chamber 303 between each of the first step 601, the second step 603, and the third step 605, and any other suitable steps, such as ramping steps and stabilization steps, may also be used, and all such combination of steps are fully intended to be included within the scope of the embodiments.

For example, the epitaxial growth system 300 may also include a purge gas delivery system 314 to deliver a purge gas to the epitaxial growth chamber 303. In an embodiment the purge gas delivery system 314 may be a gaseous tank or other facility that provides a purge gas such as nitrogen, argon, xenon, or other non-reactive gas to the epitaxial growth chamber 303. Additionally, during a purge the control unit 315 may also initiate the vacuum pump 323 in order to apply a pressure differential to the epitaxial growth chamber 303 to aid in the removal of the precursor materials between the various steps, such as between the first step 601, the second step 603, and the third step 605. The purge gas, along with the vacuum pump 323, may purge the precursor materials from the epitaxial growth chamber 303.

By using the first step 601, the second step 603, and the third step 605 as described above, a greater degree of control over the shape of the source/drain regions 301 may be achieved. For example, the source/drain regions 301 may have a planar top surface (with a wavy depth $D_w$ of zero; see FIG. 3F below for an embodiment with a wavy depth $D_w$ greater than zero) and may also have a raise height $H_R$ at the end of the deposition process of between about 10 nm and about 100 nm. Additionally, the source/drain region 301 may also have a critical dimension width $W_{CD}$ of between about 10 nm and about 200 nm. As such, the source/drain region 301 may have a height to width ratio of between about 0.5 and about 10, such as about 1 or 0.5. However, any suitable dimensions may be utilized.

After the source/drain regions 301 have been formed, an optional silicide process can be used to form silicide contacts (not shown) along the source/drain regions 301. The silicide contacts may comprise nickel, cobalt, platinum, or erbium in order to reduce the Schottky barrier height of the contact. However, other commonly used metals, such as titanium, palladium, and the like, may also be used. As is known in the art, the silicidation may be performed by blanket deposition of an appropriate metal layer, followed by an annealing step which causes the metal to react with the underlying exposed silicon. Un-reacted metal is then removed, such as through a selective etch process, and a second anneal may be performed for a silicide phase adjustment. The thickness of the silicide contacts may be between about 5 nm and about 50 nm.

Once formed, additional processing steps may be performed in order to continue the manufacturing process of the semiconductor device. For example, an interlayer dielectric may be deposited over the fins 105, and contacts (not separately illustrated) may be formed to electrically connect the gate electrode 111 and the source/drain regions 301 to overlying metallization layers (not separately illustrated). In another embodiment the gate electrode 111 may be removed and replaced with another material. Any other suitable front end of line processing or back end of line processing may be used to help complete the semiconductor device for a finished product.

Figure 3F:
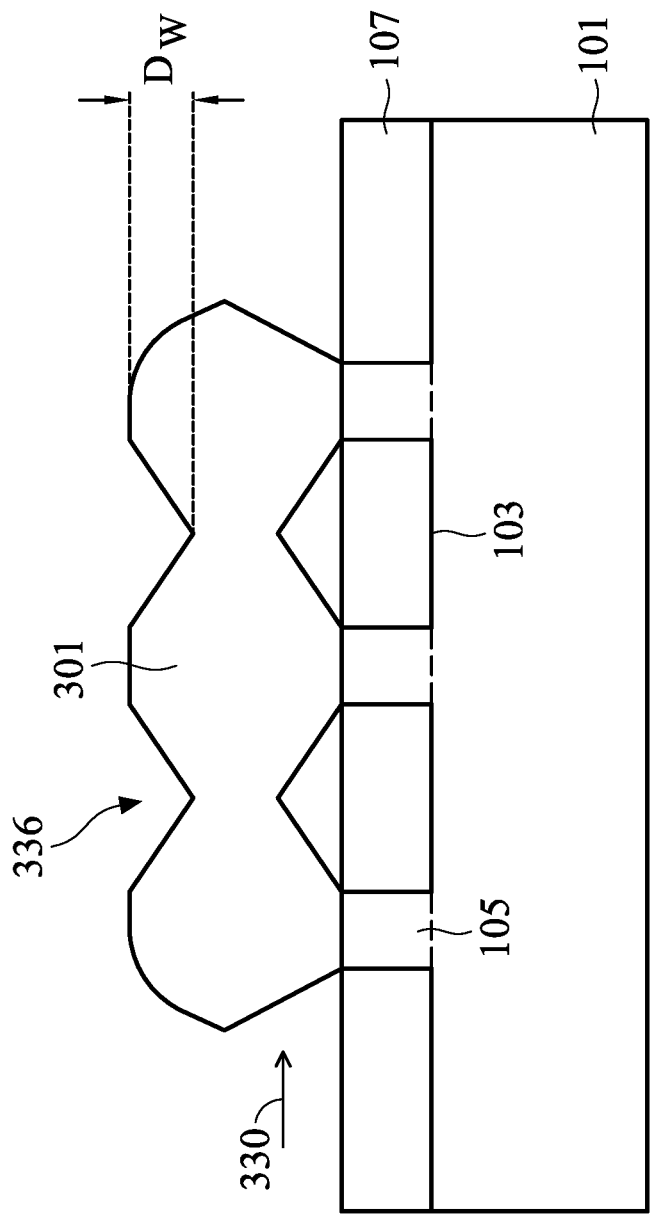

FIG. 3F illustrates another embodiment in which the top surface of the source/drain regions 301 is not planar (as described above with respect to FIG. 3C). Rather, in this embodiment there are a number of waves 336 that extend into the top surface of the source/drain region 301. In this embodiment each of the individual waves 336 may have a wavy depth $D_w$ that is greater than zero and less than or equal to about 30 nm. However, any suitable depth may be utilized. The wavy depth $D_w$ may be modified by changing the process conditions for the introduction of the shaping precursor (e.g., germanium). For example, in an embodiment in which the wavy depth $D_w$ is less than or equal to about 30 nm, the process conditions for the introduction of the shaping precursor may include a shaping precursor flow rate of between about 10 sccm and about 30000 sccm.

Figure 5A:
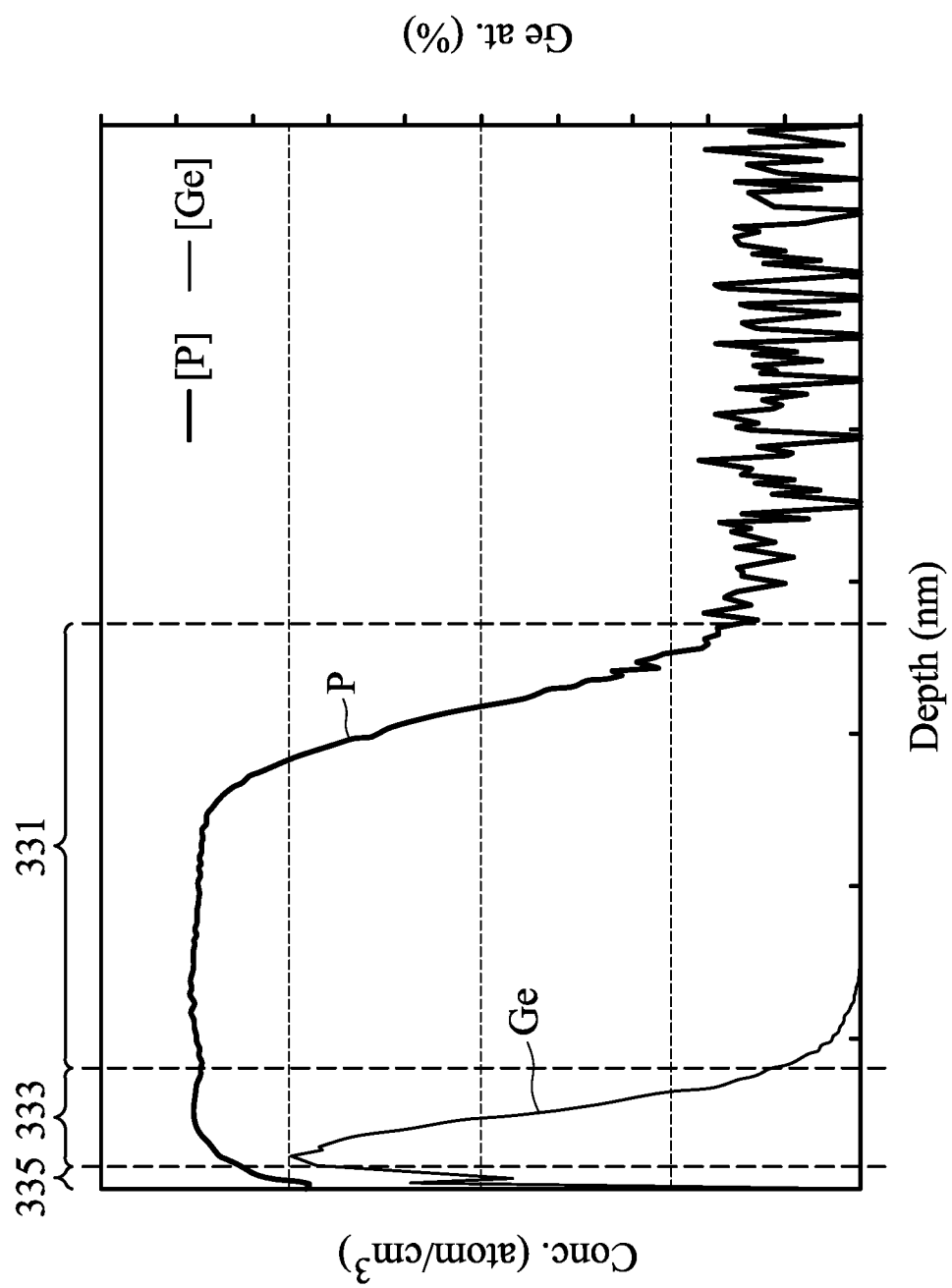
FIGS. 5A-5B illustrate concentration data of a source/drain region in accordance with some embodiments.
Figure 5B:
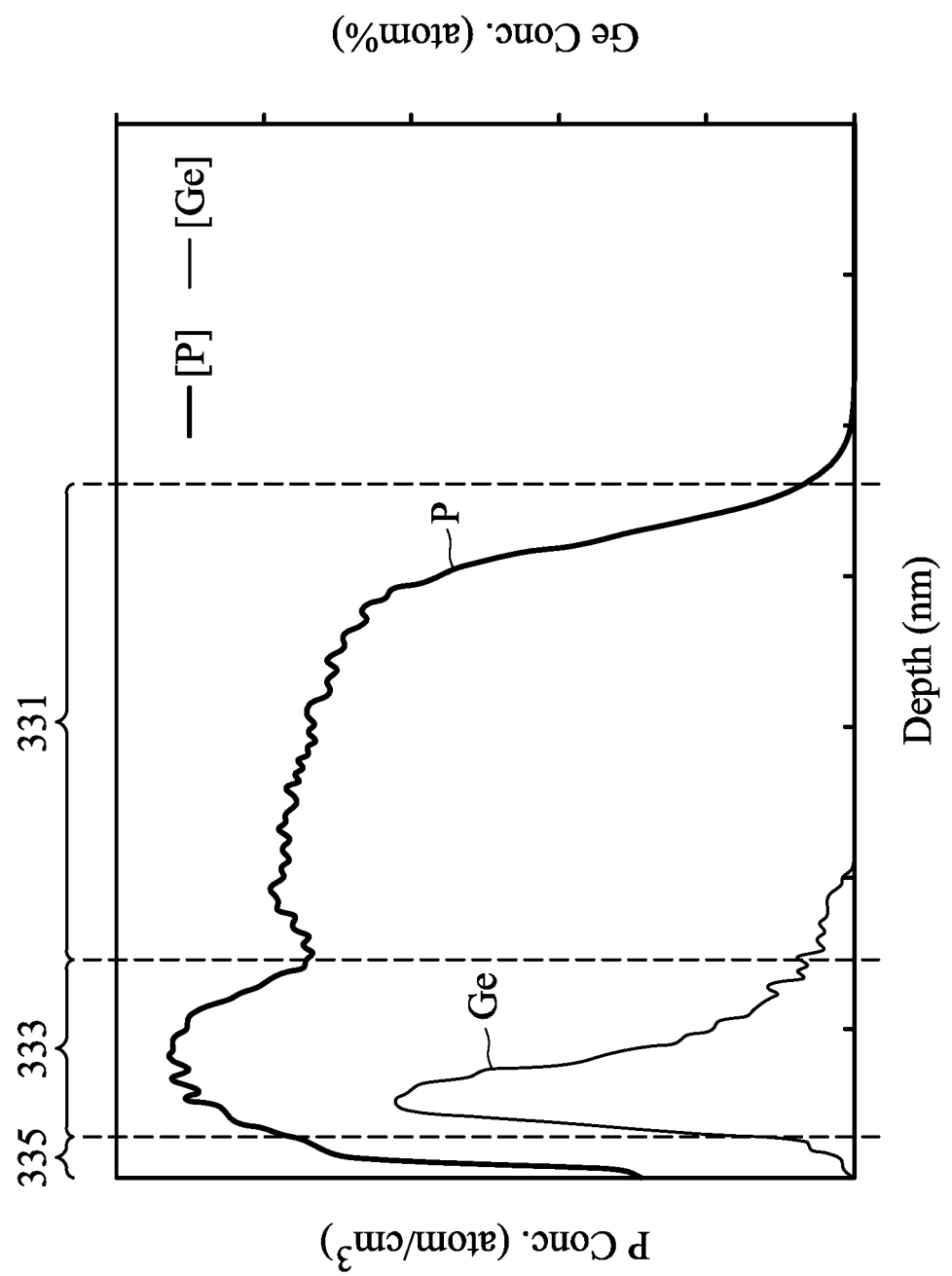

FIGS. 5A-5B are charts that illustrate the germanium and phosphorous concentrations in atomic percentages of the same sample after using a process such as described above with respect to FIGS. 1-3F. As can be seen, in each embodiment the germanium concentration increases within the shaping section 333, and decreases on either side of the shaping section 333. Additionally, the phosphorous concentration is relatively stable within the bulk section 331 of the source/drain region 301, dips down slightly at the transition between the bulk section 331 of the source/drain region 301 and the shaping section 333 of the source/drain region 301, and then increases again within the shaping section 333.

Figure 6:
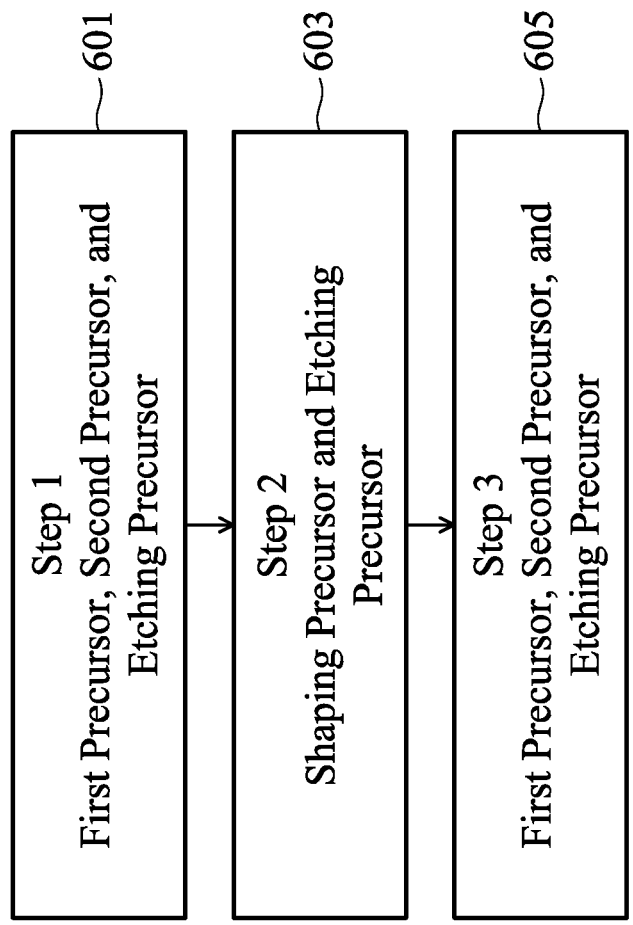
FIG. 6 illustrates a summary of a process flow for the regrowth of the source/drain regions in accordance with some embodiments.

FIG. 6 illustrates a summary of the process steps described above that are used to form the bulk section 331, the shaping section 333, and the finishing section 335 of the source/drain regions 301. In the first step 601, the bulk section 331 of the source/drain region 301 is formed using the first precursor, the second precursor, and the etching precursor. In the second step 603, the shaping section 333 of the source/drain regions 301 is formed using the shaping precursor and the etching precursor. Finally, in the third step 605, the finishing section 335 of the source/drain regions 301 is formed using the first precursor, the second precursor, and the etching precursor.

By using the second step 603 to introduce the shaping precursor (e.g., germanium), the etching efficiency of the etching precursor (e.g., HCl) may be improved during the epitaxial growth process. As such, a higher etching selectivity loss window may be achieved, and the shape of the epitaxial growth may be better controlled through an improvement in the selectivity loss. Accordingly, problems with smaller pitch sizes leading to more marginal merge windows may be overcome.

Figure 7A:
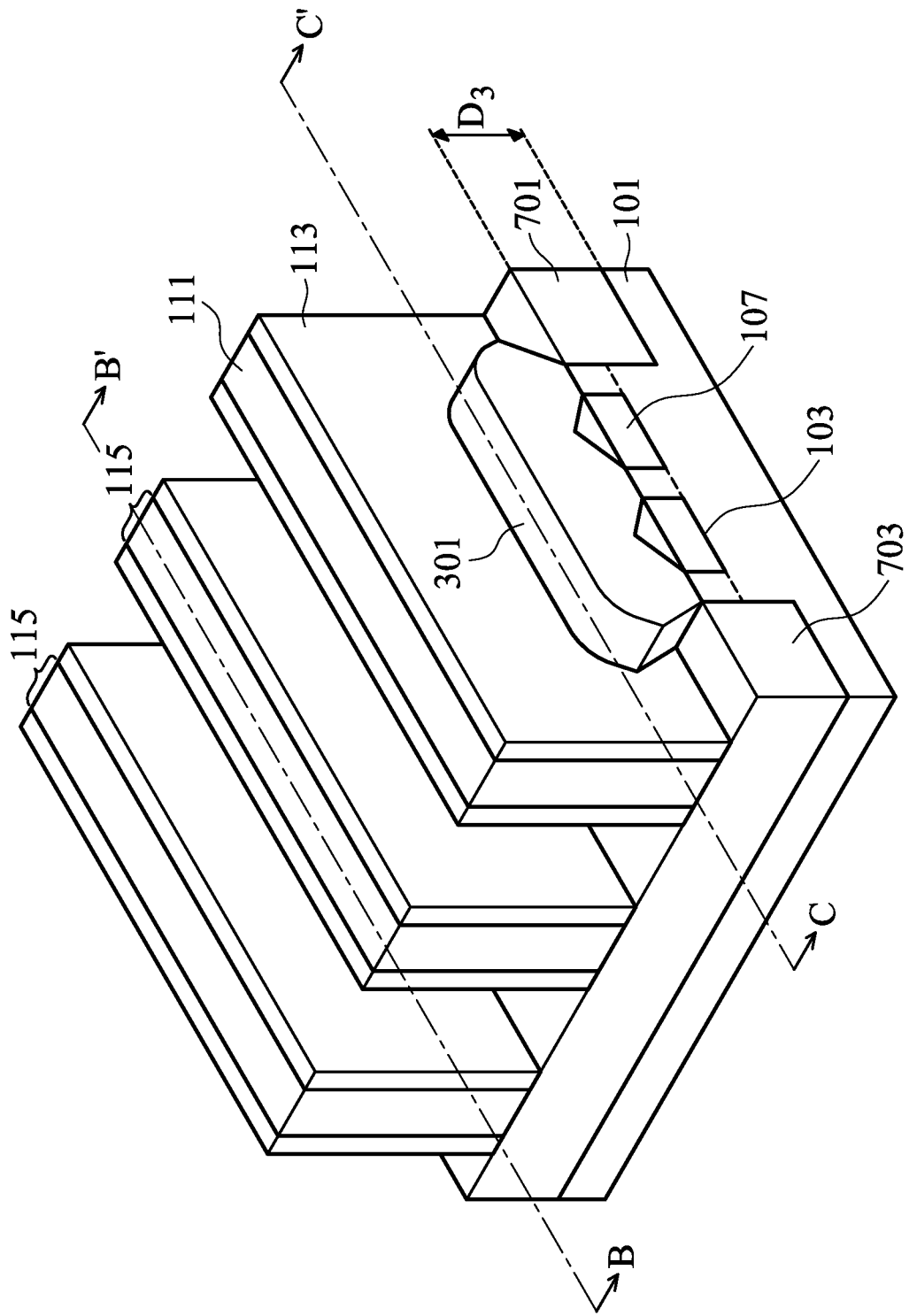
FIGS. 7A-7C illustrates another embodiment which uses different depths for interfin isolation regions and intrafin isolation regions in accordance with some embodiments.
Figure 7B:
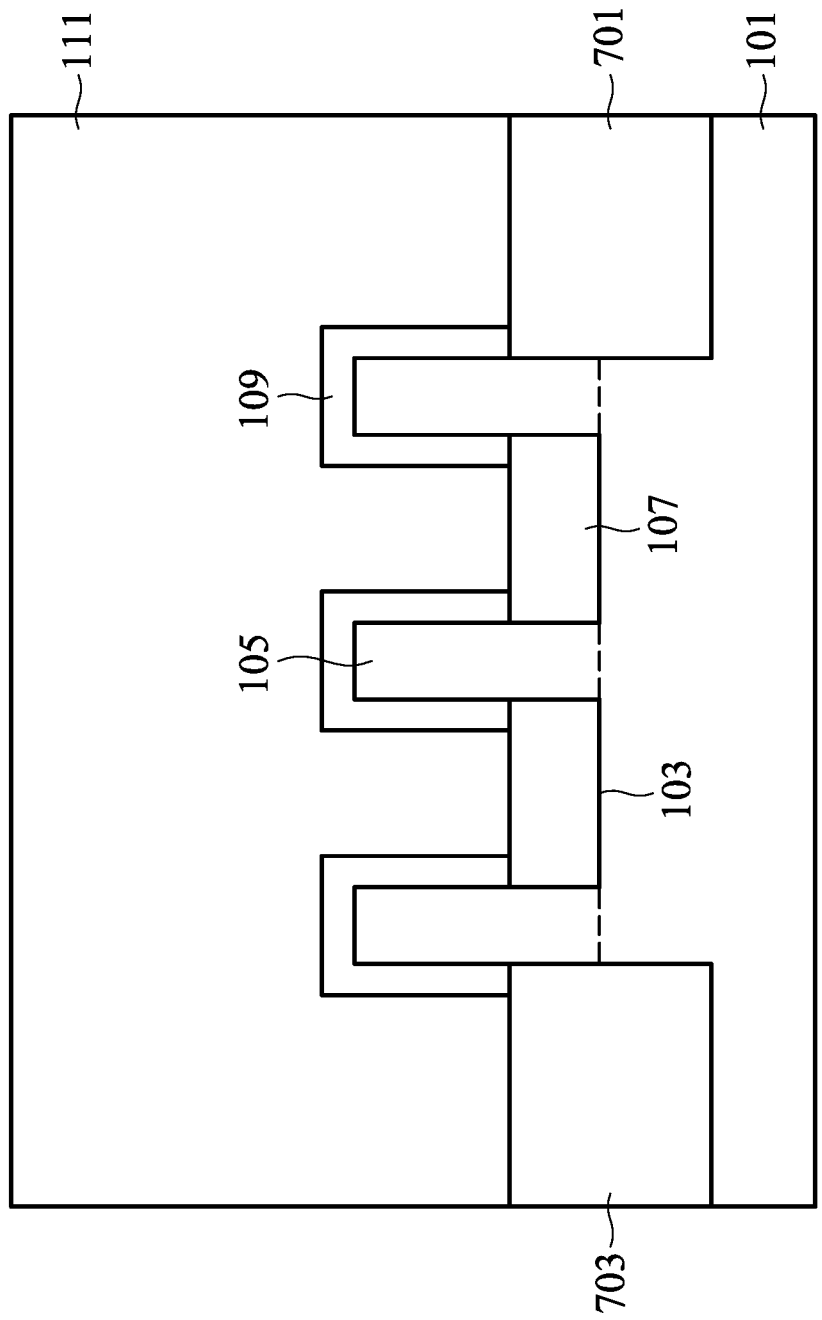
Figure 7C:
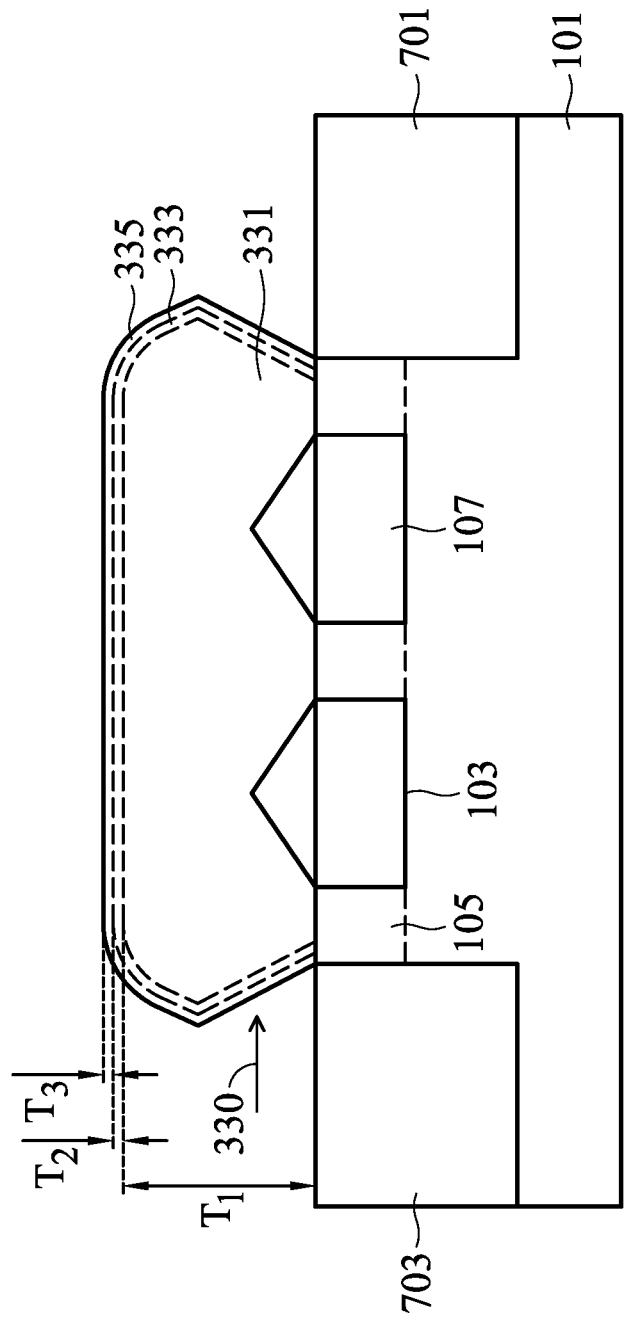

FIGS. 7A-7C illustrate another embodiment in which the first isolation regions 107 are used to isolate the fins 105 from each other, and second isolation regions 701 are used to isolate the fins 105 from other sections of the substrate 101 such as separate groupings of fins 105 (not separately illustrated), with FIGS. 7B and 7C being cross-sectional views of FIG. 7A along lines B-B' and C-C', respectively. In this embodiment the second isolation regions 701 may be formed by initially forming second trenches 703. The second trenches 703 may be formed prior to, after, or even partially along with the first trenches 103, such as by using a photolithographic masking and etching process similar to the process described above with respect to the formation of the first trenches 103. For example, in one embodiment openings for the second trenches 703 may be initially made within the substrate 101 with a first masking and etching process and then these openings may be extended at the same time that the first trenches 103 are formed with a second masking and etching process. However, the second trenches 703 may be formed to extend a third distance $D_3$ from the top of the substrate 101 and the fins 105 that is deeper than the first trenches 103. In a particular embodiment the first trenches 103 may be formed to have a depth of between about 100 Å and about 1,500 Å, such as about 1,000 Å, and the second trenches 703 may be formed such that the third distance $D_3$ is between about 200 Å and about 7,000 Å, such as about 3,190 Å. However, any suitable depths may be utilized.

Once the second trenches 703 have been formed along with the first trenches 103, the first trenches 103 and the second trenches 703 may be filled with the dielectric material to form the first isolation regions 107 and the second isolation region 701. In an embodiment the first trenches 103 and the second trenches 703 may be filled as described above with respect to FIG. 1. For example, the dielectric material may be deposited such that the dielectric material fills the first trenches 103 and the second trenches 703, and then the dielectric material may be recessed to expose the top surfaces of the fins 105 and form the first isolation regions 107 and the second isolation regions 701. Once the first isolation regions 107 and the second isolation regions 701 have been formed, processing may continue as described above to form the gate stacks 115 and the source/drain regions 301. For example, the source/drain regions 301 may be formed with the bulk section 331, the shaping section 333, and the finishing section 335.

By utilizing the second isolation regions 701 along with the first isolation regions 107, a better tuning of the isolation may be obtained. For example, the first isolation regions 107 may be tuned to the specific desires of intra-fin isolation (between fins 105 covered by a same gate stack 115), while the second isolation regions 701 may be tuned to the specific desires of inter-fin isolation (between fins 105 covered by separated gate stack, not separately illustrated). Such ability to tune the isolation regions allows for greater process variability.

Figure 8:
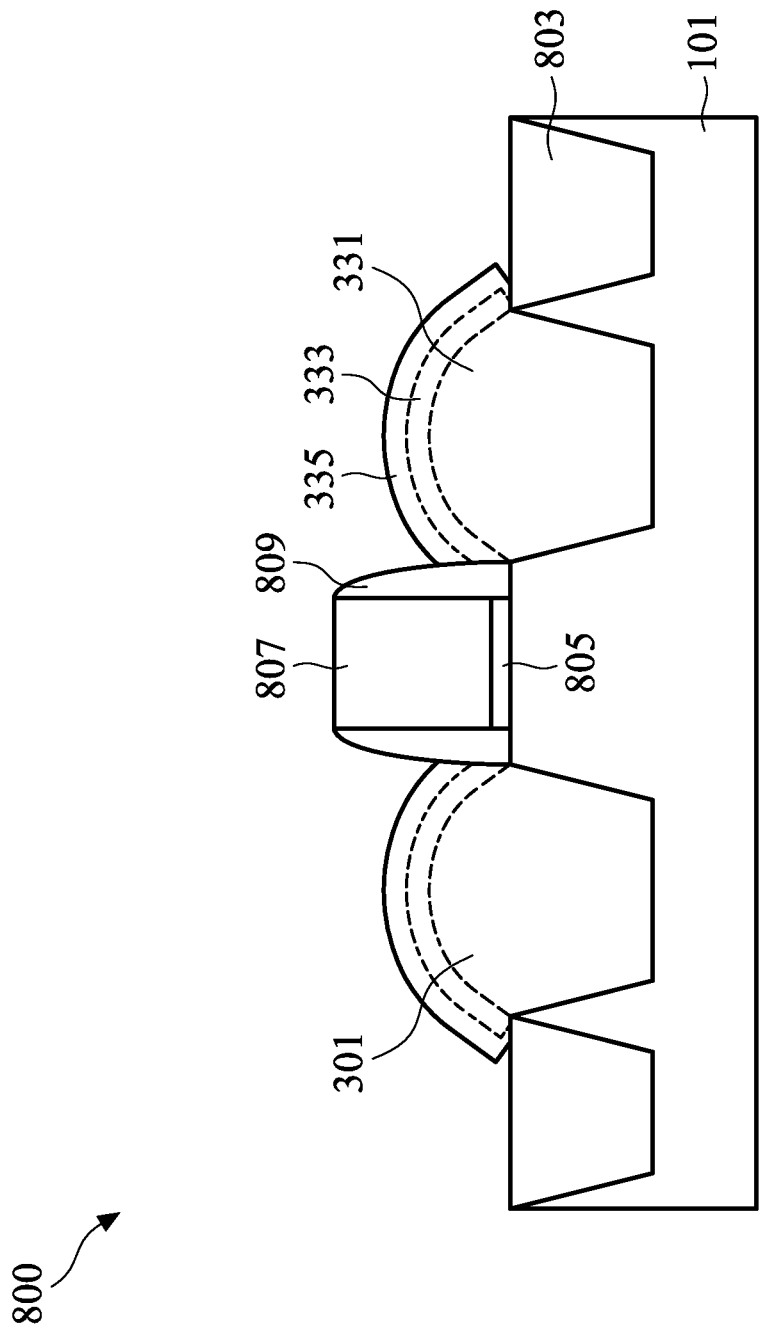
FIG. 8 illustrates another embodiment in which the source/drain regions are utilized within a planar transistor in accordance with some embodiments.

FIG. 8 illustrates another embodiment in which the source/drain region 301 is formed as part of a planar transistor 800. In this embodiment, shallow trench isolations 803 are initially formed within the substrate 101 using a masking and etching process to form trenches within the substrate 101, filling the trenches with a dielectric material, and then planarizing the dielectric material with the substrate 101. Once the shallow trench isolations 803 have been formed, a planar transistor gate dielectric 805, a planar transistor gate electrode 807, and planar transistor spacers 809 are formed. For example, a layer of material for the planar transistor gate dielectric 805 may be deposited or grown on the substrate 101, followed by a layer of material for the planar transistor gate electrode 807. In an embodiment the materials and deposition processes for the planar transistor gate dielectric 805 and the planar transistor gate electrode 807 are as described above with respect to the gate dielectric 109 and the gate electrode 111, although they may be different.

Once the materials for the planar transistor gate dielectric 805 and the planar transistor gate electrode 807 have been formed, the materials may be patterned to form the planar transistor gate dielectric 805 and the planar transistor gate electrode 807. The patterning may be performed using a photolithographic masking and etching process. Once the planar transistor gate dielectric 805 and the planar transistor gate electrode 807 have been patterned, the planar transistor spacers 809 may be formed. In an embodiment the planar transistor spacers 809 are formed as described above with respect to the first spacers 113, although they may be formed differently.

Once the planar transistor spacers 809 have been formed, openings for the source/drain regions 301 may be formed within the substrate 101. In an embodiment the openings for the source/drain regions 301 maybe formed within the substrate 101 using, e.g., a photolithographic masking and etching process. When the openings for the source/drain region 301 have been formed, the source/drain regions 301 may be grown within the openings for the source/drain region 301. In an embodiment the source/drain regions 301 may be regrown as described above with respect to FIGS. 3A-3E. For example, the substrate 101 may be placed within the epitaxial growth chamber 303, and the source/drain regions 301 may be grown with the bulk section 331, the shaping section 333, and the finishing section 335.

By utilizing the growth process described with respect to FIGS. 3A-3E within a planar transistor 800, the same benefits may be achieved for shaping and control for a FinFET process may also be applied to a planar transistor. For example, by modifying the lateral etch rate of the etching precursor, a higher and more narrow source/drain region 301 may be obtained.

In accordance with an embodiment, a method of forming a semiconductor device comprising epitaxially growing a bulk source/drain region onto a substrate using a first precursor and a second precursor and cleaning the bulk source/drain region, wherein the cleaning the bulk source/drain region modifies a crystalline structure of a surface of the bulk source/drain region. A finishing region is epitaxially grown onto the bulk source/drain region after the cleaning the bulk source/drain region.

In accordance with another embodiment, a method of forming a semiconductor device comprising growing a first layer of a first material onto a substrate in a first step, wherein the growing the first layer comprises introducing a first precursor, a second precursor, and an etchant with a first lateral etch rate of the first material. The first lateral etch rate of the first material by the etchant is increased to a second lateral etch rate in a second step after the first step and a second layer of the first material is grown onto the first layer in a third step, wherein the growing the second layer of the first material comprises introducing the first precursor, the second precursor, and the etchant.

In accordance with yet another embodiment, a semiconductor device comprising a channel region within a semiconductor material and a source/drain region adjacent to the channel region, wherein the source/drain region has a height to width ratio of between about 0.05 and about 10. The source/drain region also comprises a bulk region with a first concentration of a first dopant, an interface region with a second concentration of the first dopant less than the first concentration, and a cleaning region with a third concentration of the first dopant greater than the second concentration.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device comprising:
   a channel region within a semiconductor material; and
   a source/drain region adjacent to the channel region, wherein the source/drain region has a height to width ratio of between about 0.5 and about 10 and comprises:
      a bulk region with a first concentration of a first dopant;
      an interface region with a second concentration of the first dopant less than the first concentration; and
      a cleaning region with a third concentration of the first dopant greater than the second concentration and the first concentration, wherein the interface region is between the bulk region and the cleaning region.

2. The semiconductor device of claim 1, wherein the first dopant is phosphorous.

3. The semiconductor device of claim 1, wherein the cleaning region comprises a shaping dopant that is not present in the bulk region.

4. The semiconductor device of claim 3, wherein the shaping dopant is germanium.

5. The semiconductor device of claim 4, wherein the germanium has a fourth concentration within the cleaning region of between about 1% and about 10%.

6. The semiconductor device of claim 1, wherein the first concentration is between about 1E+20 atom/cm3 and about 1E+23 atom/cm3 and the second concentration is between about 1E+20 atom/cm3 and about 1E+24 atom/cm3.

7. The semiconductor device of claim 1, wherein the cleaning region has a thickness of between about 1 nm and about 50 nm.

8. The semiconductor device of claim 1, wherein the source/drain region has a planar top surface.

9. The semiconductor device of claim 1, wherein the source/drain region has a wavy top surface.

10. The semiconductor device of claim 1, wherein the source/drain region further comprises:
    a finishing region with a fourth concentration of the first dopant less than the third concentration and the first concentration.

11. The semiconductor device of claim 10, wherein the cleaning region comprises a shaping dopant that is not present in the finishing region or the bulk region.

12. The semiconductor device of claim 1, wherein the semiconductor material is silicon.

13. A semiconductor device comprising:
    a plurality of fins extending from a substrate, each of the fins having a channel region;
    a source/drain region contacting each of the fins, the source/drain region having a planar top surface, the source/drain region having a height to width ratio of between about 0.05 and about 10, the source/drain region comprising:
       a bulk section adjacent the channel region of each of the fins, the bulk section comprising a first dopant;
       a shaping section on the bulk section, the shaping section comprising the first dopant, the shaping section having a thickness of between about 1 nm and about 50 nm; and
       a finishing section on the shaping section, the finishing section comprising the first dopant,
       wherein a concentration of the first dopant at an interface of the bulk section and the shaping section is less than a concentration of the first dopant in the bulk section and less than a concentration of the first dopant in the shaping section.

14. The semiconductor device of claim 13, wherein the first dopant is phosphorous.

15. The semiconductor device of claim 13, wherein the bulk section, the shaping section, and the finishing section further comprise a second dopant, a concentration of the second dopant in the shaping section being greater than a concentration of the second dopant in the bulk section and a concentration of the second dopant in the finishing section.

16. The semiconductor device of claim 15, wherein the second dopant is germanium.

17. The semiconductor device of claim 16, wherein the germanium has a concentration within the shaping section of between about 1% and about 10%.

18. A semiconductor device comprising:
a source/drain region adjacent a channel region of a substrate, the source/drain region comprising a first dopant and a second dopant, the source/drain region having:
a bulk section;
a shaping section on the bulk section; and
a finishing section on the shaping section,
wherein a concentration of the first dopant at an interface of the bulk section and the shaping section is less than a concentration of the first dopant in the bulk section and less than a concentration of the first dopant in the shaping section, and
wherein a concentration of the second dopant in the shaping section is greater than a concentration of the second dopant in the bulk section and a concentration of the second dopant in the finishing section.

19. The semiconductor device of claim 18, wherein the first dopant is phosphorous and the second dopant is germanium.

20. The semiconductor device of claim 18, wherein the shaping section has a thickness of between about 1 nm and about 50 nm.

* * * * *